(12) United States Patent
Lee

(10) Patent No.: US 11,552,138 B2
(45) Date of Patent: Jan. 10, 2023

(54) DISPLAY DEVICE INCLUDING COMPONENT AREAS WITH CORRESPONDING TRANSMISSION AREAS

(71) Applicant: Samsung Display Co., Ltd., Yongin-si (KR)

(72) Inventor: Jaesung Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 142 days.

(21) Appl. No.: 17/077,671

(22) Filed: Oct. 22, 2020

(65) Prior Publication Data

US 2021/0233976 A1    Jul. 29, 2021

(30) Foreign Application Priority Data

Jan. 23, 2020    (KR) .................. 10-2020-0009395

(51) Int. Cl.
| | | |
|---|---|---|
| *H01L 27/32* | (2006.01) | |
| *H01L 51/00* | (2006.01) | |
| *H01L 51/52* | (2006.01) | |
| *H01L 51/56* | (2006.01) | |

(52) U.S. Cl.
CPC ...... *H01L 27/3234* (2013.01); *H01L 27/3244* (2013.01); *H01L 51/0096* (2013.01); *H01L 51/56* (2013.01); *H01L 27/3211* (2013.01); *H01L 2227/323* (2013.01)

(58) Field of Classification Search
CPC ............. H01L 27/3211; H01L 27/3234; H01L 27/3244; H01L 27/3218; H01L 27/3225; H01L 27/326; H01L 27/3246; H01L 27/3248; H01L 27/3258; H01L 27/3262; H01L 27/3216; H01L 27/3295; H01L 51/0096; H01L 51/52; G02F 2001/133357
See application file for complete search history.

(56) References Cited

U.S. PATENT DOCUMENTS

| | | | |
|---|---|---|---|
| 2015/0041768 A1* | 2/2015 | You ..................... | H01L 27/326 |
| | | | 257/40 |
| 2017/0062535 A1* | 3/2017 | Kim ................... | H01L 27/3246 |
| 2017/0092894 A1* | 3/2017 | Yang .................... | H01L 27/326 |
| 2017/0256747 A1* | 9/2017 | Lee ..................... | H01L 27/3218 |
| 2017/0330923 A1* | 11/2017 | Chung ................ | H01L 51/5253 |
| 2018/0026080 A1* | 1/2018 | Lee .................... | H01L 27/3211 |
| | | | 257/40 |
| 2018/0145118 A1* | 5/2018 | Kim ...................... | H01L 51/56 |

(Continued)

FOREIGN PATENT DOCUMENTS

| | | |
|---|---|---|
| CN | 108269840 | 7/2018 |
| CN | 109962092 | 7/2019 |

(Continued)

*Primary Examiner* — Ida M Soward
(74) *Attorney, Agent, or Firm* — Kile Park Reed & Houtteman PLLC

(57) ABSTRACT

A display device includes a substrate including a display area, a first component area including a first pixel group and a first transmission area, and a second component area including a second pixel group and a second transmission area, main sub-pixels disposed in the display area, and auxiliary sub-pixels disposed in the first pixel group, wherein a first distance between adjacent ones of the auxiliary sub-pixels is different from a second distance between adjacent ones of the main sub-pixels.

20 Claims, 18 Drawing Sheets

(56) References Cited

U.S. PATENT DOCUMENTS

| | | |
|---|---|---|
| 2019/0130822 A1 | 5/2019 | Jung et al. |
| 2019/0212788 A1 | 7/2019 | Kwak et al. |
| 2019/0326366 A1 | 10/2019 | Fan et al. |
| 2020/0058728 A1* | 2/2020 | Song .................... H01L 27/3276 |
| 2020/0176526 A1* | 6/2020 | Yoon ..................... G09G 3/3233 |
| 2020/0203453 A1* | 6/2020 | Kim ...................... H01L 27/3276 |
| 2020/0235187 A1* | 7/2020 | Bae ...................... H01L 27/3272 |
| 2020/0312926 A1* | 10/2020 | Bae ...................... H01L 27/3234 |
| 2021/0408182 A1* | 12/2021 | Chung ................ H01L 27/3246 |

FOREIGN PATENT DOCUMENTS

| | | |
|---|---|---|
| KR | 10-2017-0113066 | 10/2017 |
| KR | 10-2019-0066795 | 6/2019 |
| KR | 10-2019-0084397 | 7/2019 |

* cited by examiner

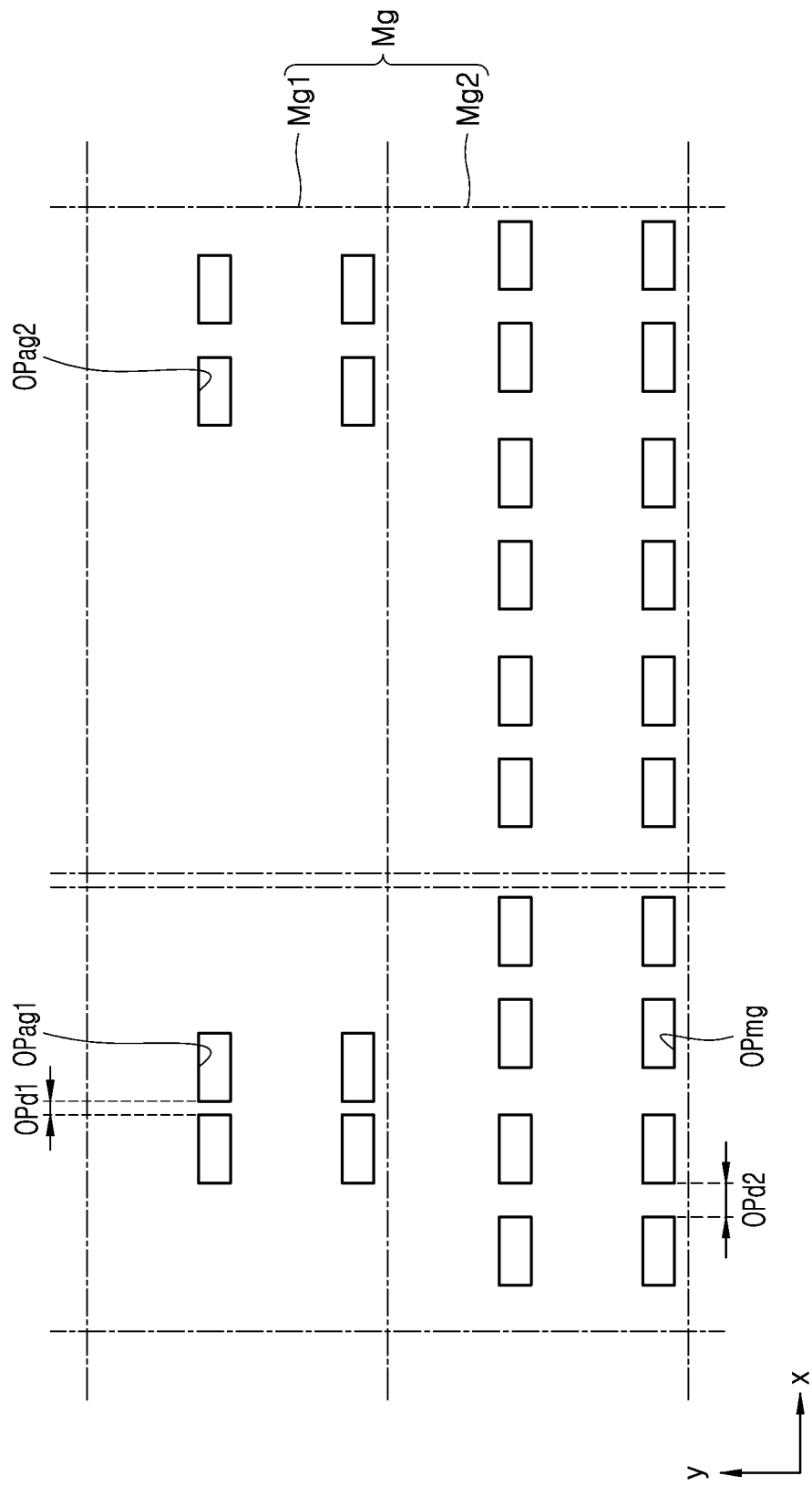

DISPLAY DEVICE INCLUDING COMPONENT AREAS WITH CORRESPONDING TRANSMISSION AREAS

CROSS-REFERENCE TO RELATED APPLICATION(S)

This application claims priority to and benefits of Korean Patent Application No. 10-2020-0009395 under 35 U.S.C. § 119, filed in the Korean Intellectual Property Office on Jan. 23, 2020, the entire contents of which are incorporated herein by reference.

BACKGROUND

1. Technical Field

One or more embodiments relate to a display device including a transmission area.

2. Description of the Related Art

Recently, the usage of display devices has diversified. As display devices have become thinner and lighter, their range of use has gradually been extended.

As the area occupied by a display area of a display device expands, various functions that may be combined or associated with a display device have been added. In order to add various functions while also expanding the display area, research is being carried out on display devices having a region for performing various functions while also displaying an image.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display device that may include a display panel having a display area and a component area. Particularly, the component area may include a first component area and a second component area, the second component area having a transmittance different from that of the first component area. Therefore, one or more embodiments include a display device in which components suited for transmittance specification may be arranged.

Additional aspects will be set forth in part in the description which follows and, in part, will be apparent from the description, or may be learned by practice of the presented embodiments of the disclosure.

According to one or more embodiments, a display device may include a substrate including a display area, a first component area including a first pixel group and a first transmission area, and a second component area including a second pixel group and a second transmission area, main sub-pixels disposed in the display area, and auxiliary sub-pixels disposed in the first pixel group. A first distance between adjacent ones of the auxiliary sub-pixels may be different from a second distance between adjacent ones of the main sub-pixels.

The first distance may be between centers of the adjacent ones, respectively, of the auxiliary sub-pixels, and the second distance may be between centers of the adjacent ones, respectively, of the main sub-pixels.

An area of the second transmission area may be greater than an area of the first transmission area.

The first distance may be less than the second distance.

A ratio of the first transmission area to the first component area may be less than a ratio of the second transmission area to the second component area.

The display device may further include a first component disposed in the first component area, and a second component disposed in the second component area.

The first component and the second component may be disposed below the substrate.

The first component may include at least one of a proximity sensor and an ambient light sensor.

The second component may include at least one of a camera, an infrared (IR) camera, a dot projector, an infrared (IR) illuminator, and a time-of-flight (ToF) sensor.

The substrate may further include an opening area in which a through hole is disposed, the through hole passing through the substrate. The display device may further include a third component corresponding to the through hole, the third component being disposed below the substrate.

According to one or more embodiments, a display device may include a substrate including a display area, a first component area including a first transmission area, and a second component area including a second transmission area, a first component disposed in the first component area, a second component disposed in the second component area, and sub-pixels disposed over the substrate. An area of the second transmission area may be greater than an area of the first transmission area.

The first component and the second component may be disposed below the substrate.

The first component may include at least one of a proximity sensor and an ambient light sensor.

The second component may include at least one of a camera, an infrared (IR) camera, a dot projector, an infrared (IR) illuminator, and a time-of-flight (ToF) sensor.

The sub-pixels may include auxiliary sub-pixels disposed in the first component area, and main sub-pixels disposed in the display area. A first distance between adjacent ones of the auxiliary sub-pixels may be different from a second distance between adjacent ones of the main sub-pixels.

The first distance may be between centers of the adjacent ones, respectively, of the auxiliary sub-pixels, and the second distance may be between centers of the adjacent ones, respectively, of the main sub-pixels.

The first distance may be less than the second distance.

The substrate may further include an opening area in which a through hole is disposed, the through hole passing through the substrate.

The display device may further include a third component corresponding to the through hole, the third component being disposed below the substrate and being different from the first component.

The display device may further include a gate an insulating layer and a planarization layer that may be disposed between the substrate and the sub-pixels, a first transmission hole disposed in the at least one planarization, the first transmission hole corresponding to the first transmission area, and a second transmission hole disposed in the gate insulating layer and the planarization layer, the second transmission hole corresponding to the second transmission area.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 9A to 9C are schematic plan views of examples of a first mask to a third mask used for manufacturing a display device according to an embodiment;

DETAILED DESCRIPTION OF THE EMBODIMENTS

Figure 1A:
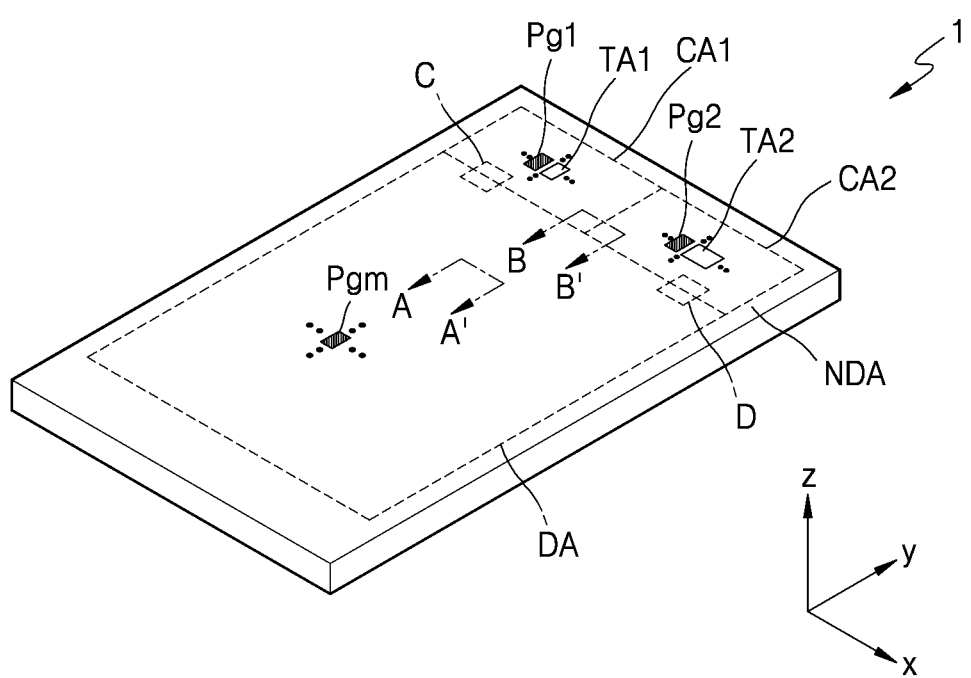
FIG. 1A is a schematic perspective view of a display device according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, the embodiments are merely described below, by referring to the figures, to explain aspects of the description.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or." Throughout the disclosure, the expression "at least one of" is intended to include the meaning of "at least one selected from the group of". For example, "at least one of a, b and c" indicates only a, only b, only c, both a and b, both a and c, both b and c, all of a, b, and c, or variations thereof.

As the disclosure allows for various changes and numerous embodiments, only some embodiments will be illustrated in the drawings and described in detail in the written description. Effects and characteristics of the disclosure, and a method of accomplishing the same will become apparent and more readily appreciated from the following description of the embodiments and the accompanying drawings. However, the disclosure is not limited to embodiments below and may be implemented in various forms.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that terms such as "comprises", "comprising", "has", "having", "includes", and "including" as used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. For example, intervening layers, regions, or components may be present.

Sizes of elements in the drawings may be exaggerated or reduced for convenience of explanation. In other words, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component and/or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component and/or may be "indirectly electrically connected" to other layer, region, or component with other layer, region, or component interposed therebetween.

The term overlap may include layer, stack, face or facing, extending over, extending under, covering or partly covering or any other suitable term as would be appreciated and understood by those of ordinary skill in the art.

Terms such as "about" as used herein are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

A display device 1 may be an apparatus displaying an image and may include mobile apparatuses such as game consoles, multimedia apparatuses, and ultra-miniaturized personal computers (PC). The display device 1 may include liquid crystal displays, electrophoretic displays, organic light-emitting displays, inorganic light-emitting displays, field-emission displays, surface-conduction electron-emitter displays, quantum dot displays, plasma displays, and cathode ray displays. Hereinafter, though an organic light-emitting display device may be described as the display device 1 according to an embodiment as an example, embodiments may include the various display devices described above.

Figure 1B:
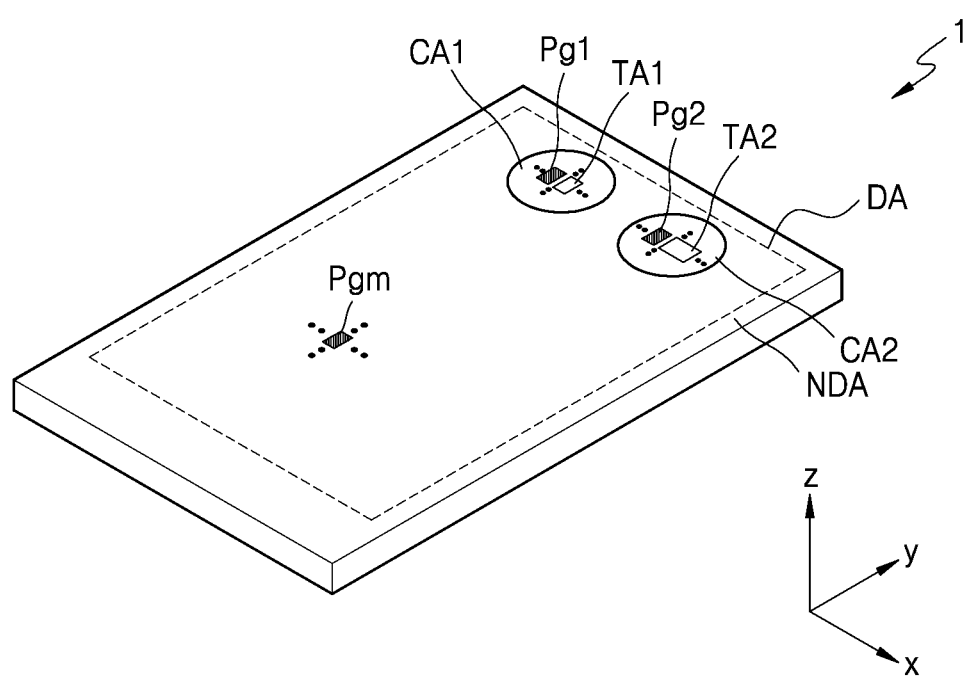
FIG. 1B is a schematic perspective view of a display device according to another embodiment.

FIG. 1A is a schematic perspective view of the display device 1 according to an embodiment. FIG. 1B is a schematic perspective view of the display device 1 according to another embodiment.

Referring to FIG. 1A, the display device 1 may include a display area DA and a non-display area NDA, the display area DA displaying an image, and the non-display area NDA not displaying an image. The display device 1 may display a main image by using light emitted from a main pixel group Pgm arranged in the display area DA. Specifically, the main pixel group Pgm may include main sub-pixels. The main sub-pixels may emit light. Main pixel groups Pgm may be arranged in the display area DA.

The display device 1 may include a first component area CA1 and a second component area CA2. As described below with reference to FIG. 2, the first component area CA1 and the second component area CA2 may include regions in which a component such as a sensor that uses infrared light, visible light, or sound, etc. may be arranged.

In an embodiment, the first component area CA1 may be at least partially surrounded by the display area DA. The first component area CA1 may be at least partially surrounded by the non-display area NDA. Though it is shown in FIG. 1A that the first component area CA1 is arranged on one side of the display area DA, the first component area CA1 may be variously arranged inside the non-display area NDA. Though it is shown in FIG. 1A that the first component area CA1 is at least partially extended to the second component area CA2, the first component area CA1 may be apart from the second component area CA2.

In an embodiment, the second component area CA2 may be arranged similar to the first component area CA1. Specifically, the second component area CA2 may be at least partially surrounded by the display area DA. The second component area CA2 may be at least partially surrounded by the non-display area NDA. Though it is shown in FIG. 1A that the second component area CA2 is arranged on one side of the display area DA, the second component area CA2 may be variously arranged inside the non-display area NDA. Though it is shown in FIG. 1A that the second component area CA2 is at least partially extended to the first component area CA1, the second component area CA2 may be apart from the first component area CA1.

The first component area CA1 and the second component area CA2 may respectively include a first transmission area TA1 and a second transmission area TA2 through which light and/or sound output to the outside from the component or progressing to the component from the outside may pass. In the case where infrared light passes through the first transmission area TA1, infrared transmittance of the entire first component area CA1 may be 15% or more, 20% or more, 25% or more, 85% or more, or 90% or more. In the case where infrared light passes through the second transmission area TA2, infrared transmittance of the entire second component area CA2 may be 15% or more, 20% or more, 25% or more, 85% or more, or 90% or more.

In an embodiment, the area of the first transmission area TA1 may be different from the area of the second transmission area TA2. In the case where infrared light passes through the first transmission area TA1 and the second transmission area TA2, infrared transmittance of the entire first component area CA1 may be different from infrared transmittance of the entire second component area CA2. In an embodiment, the area of the first transmission area TA1 may be greater than the area of the second transmission area TA2. For example, the width of the first transmission area TA1 in an x-direction may be less than the width of the second transmission area TA2 in the x-direction. For another example, the width of the first transmission area TA1 in a y-direction may be less than the width of the second transmission area TA2 in the y-direction. An infrared transmittance of the first component area CA1 may be less than an infrared transmittance of the second component area CA2. Hereinafter, the case where the width of the first transmission area TA1 in the x-direction may be less than the width of the second transmission area TA2 in the y-direction is described.

In an embodiment, a first pixel group Pg1 may be arranged in the first component area CA1. Multiple first pixel groups Pg1 may be arranged in the first component area CA1. In addition, the first pixel groups Pg1 each may include first auxiliary sub-pixels. The first auxiliary sub-pixels may provide an image by emitting light. An image displayed on the first component area CA1 may include an auxiliary image and have a resolution less than a resolution of an image displayed on the display area DA. For example, since the first component area CA1 includes the first transmission area TA1 through which light and/or sound may pass, a ratio of the first pixel group Pg1 to the first component area CA1 may be less than a ratio of the main pixel group Pgm to the display area DA.

In an embodiment, a second pixel group Pg2 may be arranged in the second component area CA2. Multiple second pixel groups Pg2 may be arranged in the second component area CA2. The second pixel groups Pg2 each may include second auxiliary sub-pixels. The second auxiliary sub-pixels may provide an image by emitting light. Similarly to the first component area CA1, an image displayed on the second component area CA2 may include an auxiliary image and have a resolution less than a resolution of an image displayed on the display area DA. For example, since the second component area CA2 includes the second transmission area TA2 through which light and/or sound may pass, a ratio of the second pixel group Pg2 to the second component area CA2 may be less than a ratio of the main pixel group Pgm to the display area DA. In an embodiment, the resolution of an image displayed on the second component area CA2 may be less than the resolution of an image displayed on the first component area CA1.

In an embodiment, a ratio of the first transmission area TA1 to the first component area CA1 may be less than a ratio of the second transmission area TA2 to the second component area CA2. Specifically, the ratio of the first transmission area TA1 to the first component area CA1 may be defined by the area of the first transmission area TA1 on an xy-plane with respect to the first component area CA1 on the xy-plane. Similarly, the ratio of the second transmission area TA2 to the second component area CA2 may be defined by the area of the second transmission area TA2 on the xy-plane with respect to the area of the second component area CA2 on the xy-plane.

Referring to FIG. 1B, it is shown that the first component area CA1 and the second component area CA2 may be entirely surrounded by the display area DA. The first component area CA1 may be apart from the second component area CA2.

In an embodiment, the first component area CA1 may have a circular shape or an elliptical shape in a plan view. In another embodiment, the first component area CA1 may have a polygonal shape such as a quadrangular shape in a plan view. In another embodiment, the first component area CA1 may include a curvature portion. The location of the first component area CA1 and the number of first component areas CA1 may be variously changed.

In an embodiment, the second component area CA2 may have a circular shape or an elliptical shape in a plan view. In another embodiment, the second component area CA2 may have a polygonal shape such as a quadrangular shape in a plan view. In another embodiment, the second component area CA2 may include a curvature portion. The location of the second component area CA2 and the number of second component areas CA2 may be variously changed.

Figure 2:
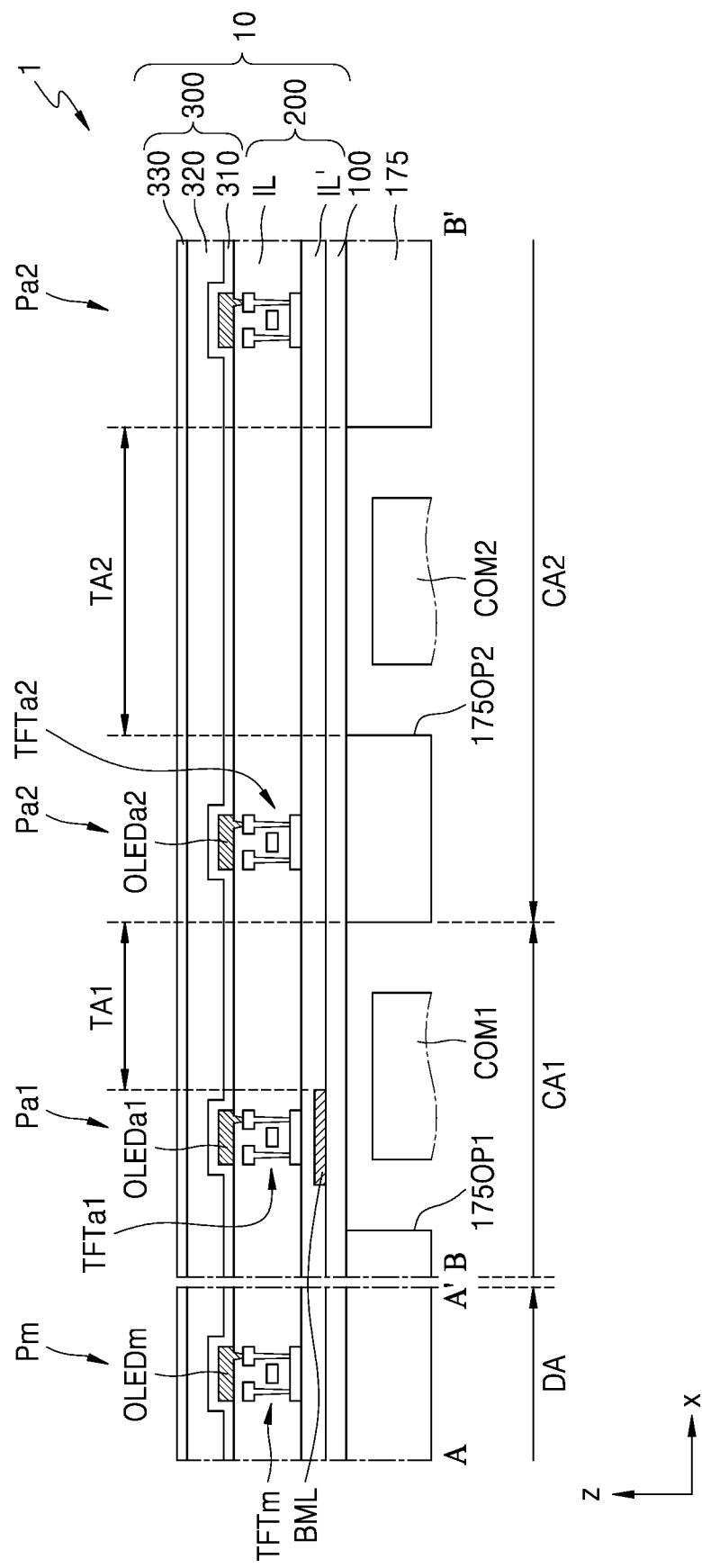
FIG. 2 is a schematic cross-sectional view of a display device according to an embodiment.

FIG. 2 is a schematic cross-sectional view of the display device 1 according to an embodiment, taken along lines A-A' and B-B' of FIG. 1A. FIG. 2 shows one main sub-pixel Pm of the main pixel group Pgm of FIG. 1A, one first auxiliary sub-pixel Pa1 of the first pixel group Pg1 of FIG. 1A, and a second auxiliary sub-pixel Pa2 of a second pixel group Pg2 of FIG. 1A.

Referring to FIG. 2, the display device 1 may include a display panel 10, a first component COM1, and a second component COM2, the display panel 10 including a display element, the first component COM1 corresponding to the first component area CA1, and the second component COM2 corresponding to the second component area CA2.

The display panel 10 may include a substrate 100, a display element layer 200, and a thin-film encapsulation layer 300, the display element layer 200 being arranged on the substrate 100, and the thin-film encapsulation layer 300 sealing the display element layer 200. Here, the first component area CA1, the second component area CA2, and the display area DA may be defined in the substrate 100. The display panel 10 may further include a bottom protective film 175 arranged under the substrate 100.

The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose tri acetate, cellulose acetate propionate, or a combination thereof.

The display element layer 200 may include a circuit layer, organic light-emitting diodes OLEDm, OLEDa1, and OLEDa2, and insulating layers IL and IL' between the circuit layer and the organic light-emitting diodes, the circuit layer including thin film transistors TFTm, TFTa1, and TFTa2, the organic light-emitting diodes OLEDm, OLEDa1, and OLEDa2 serving as display elements.

The first transmission area TA1 may be arranged in the first component area CA1, a first auxiliary thin film transistor TFTa1 and a display element may not be arranged in the first transmission area TA1. The first transmission area TA1 may include a region through which light/signal emitted from the first component COM1 or light/signal incident to the first component COM1 may pass.

The second transmission area TA2 may be arranged in the second component area CA2, a second auxiliary thin film transistor TFTa2 and a display element may not be arranged in the second transmission area TA2. The second transmission area TA2 may include a region through which light/signal emitted from the second component COM2 or light/signal incident to the second component COM2 may pass.

In an embodiment, the area of the first transmission area TA1 may be different from the area of the second transmission area TA2. Particularly, the area of the first transmission area TA1 may be less than the area of the second transmission area TA2. In other words, the width of the first transmission area TA1 in the x-direction may be less than the width of the second transmission area TA2 in the x-direction.

A bottom metal layer BML may be arranged in the first component area CA1 and may correspond to a first auxiliary sub-pixel Pa1. For example, the bottom metal layer BML may be arranged to correspond to below the first auxiliary thin film transistor TFTa1. The bottom metal layer BML may prevent external light from reaching the first auxiliary sub-pixel Pa1 including the first auxiliary thin film transistor TFTa1. For example, the bottom metal layer BML may prevent light emitted from the first component COM1 from reaching the first auxiliary sub-pixel Pa1. A constant voltage or a signal may be applied to the bottom metal layer BML to prevent the pixel circuit from being damaged by electrostatic discharge. Though not shown in FIG. 2, the bottom metal layer BML may be arranged also in the second component area CA2. The bottom metal layer BML may correspond to the second auxiliary sub-pixel Pa2.

The bottom protective film 175 may be attached to a backside of the substrate 100 to support and protect the substrate 100. The bottom protective film 175 may include a first opening 175OP1 and a second opening 175OP2, the first opening 175OP1 corresponding to the first component area CA1, and the second opening 175OP2 corresponding to the second component area CA2. Therefore, light transmittances of the first component area CA1 and the second component area CA2 may be improved. The bottom protective film 175 may include polyethylene terephthalate, polyimide, or a combination thereof. In the case where the substrate 100 includes glass, the bottom protective film 175 may be omitted.

The area of the first component area CA1 may be greater than an area in which the first component COM1 may be arranged. Therefore, the area of the first opening 175OP1 provided in the bottom protective film 175 may not coincide with the area of the first component area CA1. For example, the area of the first opening 175OP1 may be less than the area of the first component area CA1. Similarly, the area of the second component area CA2 may be greater than an area in which the second component COM2 may be arranged.

In an embodiment, the thin-film encapsulation layer 300 may include at least one inorganic encapsulation layer and at least one organic encapsulation layer. With regard to this, FIG. 2 shows an organic encapsulation layer 320 between a first inorganic encapsulation layer 310 and a second inorganic encapsulation layer 330.

The first inorganic encapsulation layer 310 and the second inorganic encapsulation layer 330 may include at least one inorganic material among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, polyimide, polyethylene, or a combination thereof. In an embodiment, the organic encapsulation layer 320 may include acrylate.

In another embodiment, the thin-film encapsulation layer 300 may have a structure in which an inner space between the substrate 100 and a top substrate may be sealed in case that the substrate 100 may be coupled to the top substrate, which may be a transparent member, by a sealing member. A moisture absorber or a filling material may be located in the inner space. The sealing member may include sealant. In another embodiment, the sealing member may include a material hardened by a laser. For example, the sealing member may include frit. Specifically, the sealing member may include a urethane-based resin, an epoxy-based resin, an acryl-based resin which are organic sealants, silicon which is inorganic sealant, or a combination thereof. The urethane-based resin may include, for example, urethane acrylate. The acryl-based resin may include, for example, butyl acrylate, ethylhexyl acrylate, or a combination thereof. The sealing member may include a material hardened by heat.

Hereinafter, the case where the thin-film encapsulation layer 300 includes the first inorganic encapsulation layer 310, the organic encapsulation layer 320, and the second inorganic encapsulation layer 330 is described.

A touch electrode layer (not shown) may be arranged on the thin-film encapsulation layer 300, and an optical functional layer (not shown) may be arranged on the touch electrode layer, the touch electrode layer including touch electrodes. The touch electrode layer may obtain coordinate information corresponding to an external input, for example, a touch event. The optical functional layer may reduce reflectivity of light (external light) incident toward the display device 1 from the outside and/or improve color purity of light emitted from the display device 1. In an embodiment, the optical functional layer may include a retarder and a polarizer. The retarder may include a film-type retarder, a liquid crystal-type retarder, or a combination thereof. The retarder may include a λ/2 retarder and/or a λ/4 retarder. The polarizer may include a film-type polarizer, a liquid crystal-type polarizer, or a combination thereof. The film-type polarizer may include a stretchable synthetic resin film, and the liquid crystal-type polarizer may include liquid crystals arranged in an arrangement. The retarder and the polarizer may further include a protective film.

In another embodiment, the optical functional layer may include a black matrix and color filters. The color filters may be arranged by taking into account colors of light emitted from pixels of the display device. Each of the color filters may include red, green, or blue pigment or dye. As another example, each of the color filters may further include a quantum dot in addition to the pigment or dye described above. As another example, some of the color filters may not include the pigment or dye described above and may include scattering particles such as titanium oxide.

In another embodiment, the optical functional layer may include a destructive interference structure. The destructive interference structure may include a first reflective layer and a second reflective layer arranged on different layers. First-reflected light and second-reflected light respectively reflected by the first reflective layer and the second reflective layer may be destructively interfered and thus reflectivity of external light may be reduced.

An adhesive member may be arranged between the touch electrode layer and the optical functional layer. For the adhesive member, a general member known to the art may be employed without limitation. The adhesive member may include a pressure sensitive adhesive (PSA).

The first component COM1 may be arranged to correspond to the first component area CA1. The first component COM1 may include an electronic element that uses light or sound. For example, the first component COM1 may include a sensor such as an infrared sensor that emits and/or receives light, a sensor that outputs and senses light or sound to measure a distance or recognize a fingerprint, a small lamp that outputs light, and/or a speaker that outputs sound. The electronic element that uses light may use light in various wavelength bands including visible light, infrared light, and ultraviolet light.

In an embodiment, the first component COM1 may include at least one of a proximity sensor and an ambient light sensor. The proximity sensor detects that an object approaches. The proximity sensor may be used for the purpose of recognizing that a moving object approaches within a distance. In an embodiment, the proximity sensor may include a Hall element and a permanent magnet. In another embodiment, the proximity sensor may include a lamp or a light-emitting diode and a light sensor. In another embodiment, the proximity sensor may detect a change in a capacitance. The ambient light sensor may be used for estimating ambient light. In an embodiment, the ambient light sensor may include a semiconductor element generating electromotive force by using a photo-galvanic effect.

In an embodiment, multiple first components COM1 may be provided to the display device 1. The multiple first components COM1 may respectively be a proximity sensor and an ambient light sensor.

The second component COM2 may be arranged to correspond to the second component area CA2. Similar to the first component COM1, the second component COM2 may include an electronic element that uses light or sound.

In an embodiment, the second component COM2 may include at least one of a camera, an infrared (IR) camera, a dot projector, an IR illuminator, and a time-of-flight (ToF) sensor. In an embodiment, the IR camera may capture an infrared image by using a charge-coupled device sensitive to infrared light (e.g. light having a wavelength ranging from about 0.7 μm to about 100 μm). The dot projector may uniformly irradiate infrared light in a pattern. The dot projector may include an emitter and a diffracting portion, the emitter emitting infrared light, and the diffracting portion dispersing the infrared light in a pattern. The IR illuminator may emit infrared light. Similar to the dot projector, the IR illuminator may include the emitter emitting infrared light. The ToF sensor may emit light (e.g. infrared light) to an object and then measure a time taken until the light returns after the light is reflected from the object. The ToF sensor may measure a distance to the object by measuring the time.

In an embodiment, second components COM2 may be provided to the display device. The second components COM2 may respectively be an infrared illuminator, a dot projector, an infrared camera, and a ToF sensor. The IR illuminator may emit light to an object. Light reflected by the object may be incident to the infrared camera.

Figure 3:
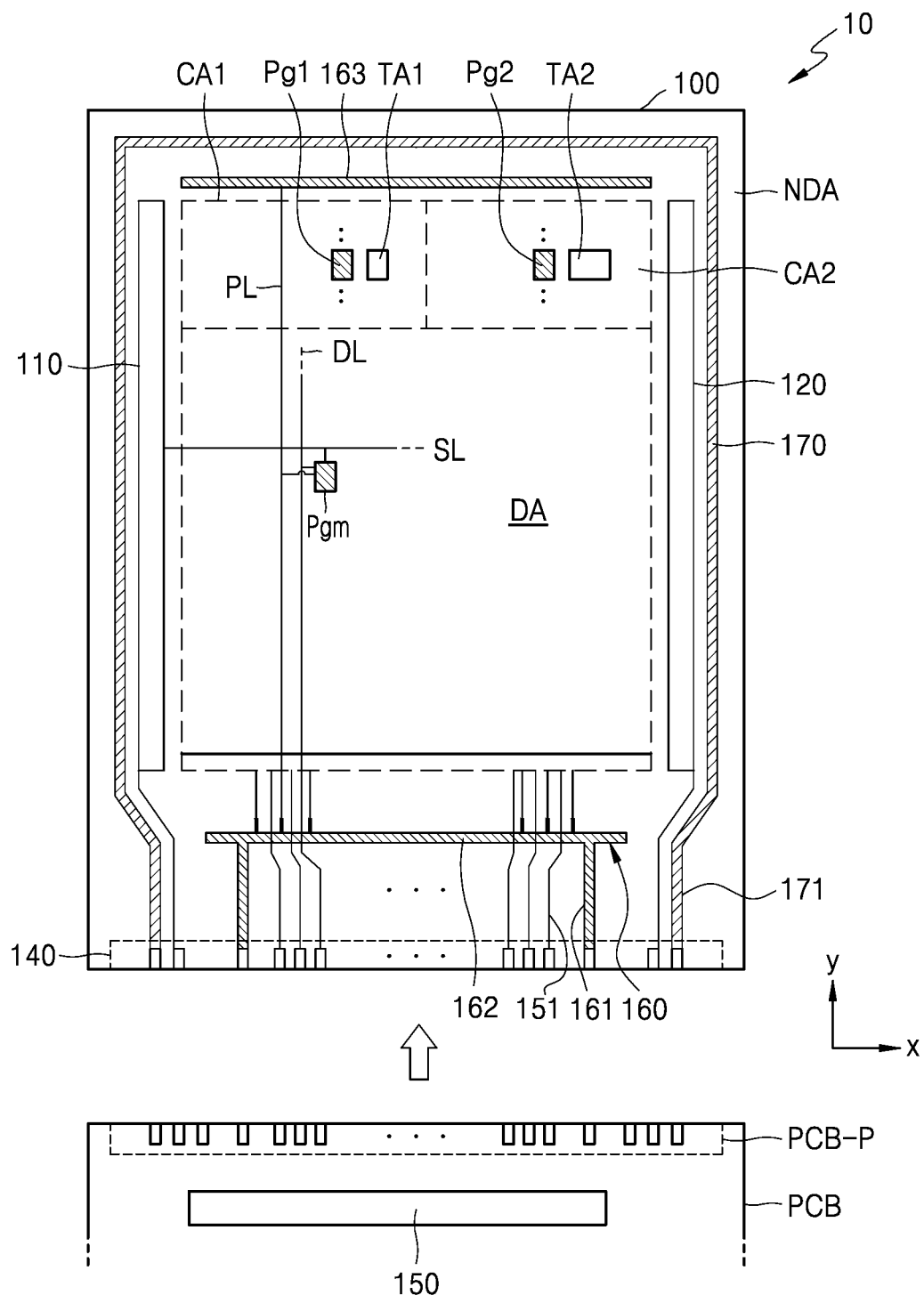
FIG. 3 is a schematic plan view of a display panel according to an embodiment.

FIG. 3 is a schematic plan view of the display panel 10 according to an embodiment.

Referring to FIG. 3, the display panel 10 may include a main pixel group Pgm, a first pixel group Pg1, a second pixel group Pg2, the main pixel group Pgm being arranged in the display area DA, the first pixel group Pg1 being included in the first component area CA1, the second pixel group Pg2 being included in the second component area CA2. Here, the substrate may be understood to include the display area DA, the first component area CA1, the second component area CA2, and the non-display area NDA.

Multiple main pixel groups Pgm may be arranged in the display area DA. Each of the main pixel groups Pgm may include a main sub-pixel. Each main pixel group Pgm may emit, for example, red, green, blue, or white light through a main sub-pixel. The main sub-pixel may be defined by an emission area of an organic light-emitting diode.

Multiple first pixel groups Pg1 may be arranged in the first component area CA1, and multiple second pixel groups Pg2 may be arranged in the second component area CA2. Similar to the main pixel group Pgm, the first pixel group Pg1 and the second pixel group Pg2 may respectively include a first auxiliary sub-pixel and a second auxiliary sub-pixel. In the specification, the first pixel group Pg1 and the second pixel group Pg2 may include a pixel group including at least one sub-pixel emitting red, green, blue, or white color as described above.

Since the first component CA1 and the second component CA2 respectively include the first transmission area TA1 and the second transmission area TA2, the resolutions of the first component area CA1 and the second component area CA2 may be less than the resolution of the display area DA. The resolution of the second component area CA2 may be less than the resolution of the first component area CA1.

Sub-pixels of the pixel groups Pmg, Pg1, and Pg2 may be electrically connected to outer circuits arranged in the non-display area NDA. A first scan driving circuit 110, a second scan driving circuit 120, a terminal 140, a data driving circuit 150, a first power supply line 160, and a second power supply line 170 may be arranged in the non-display area NDA.

The first scan driving circuit 110 may provide a scan signal to each sub-pixel through a scan line SL. The second scan driving circuit 120 may be arranged in parallel to the first scan driving circuit 110 with the display area DA therebetween. Some of the main sub-pixels arranged in the display area DA may be electrically connected to the first scan driving circuit 110, and the rest of the main sub-pixels may be electrically connected to the second scan driving circuit 120. In another embodiment, the second scan driving circuit 120 may be omitted.

The terminal 140 may be arranged on one side of the substrate 100. The terminal 140 may be exposed by not being covered by an insulating layer and be electrically connected to a printed circuit board PCB.

A terminal PCB-P of the printed circuit board PCB may be electrically connected to the terminal of the display panel 10. The printed circuit board PCB transfers a signal or power of a controller (not shown) to the display panel 10. A control signal generated by the controller may be transferred to the first scan driving circuit 110 and the second scan driving circuit 120 through the printed circuit board PCB. The controller may respectively provide a first power voltage and a second power voltage to the first power supply line 160 and the second power supply line 170 through a first connection line 161 and a second connection line 171. The first power voltage may be provided to each sub-pixel through a driving voltage line PL electrically connected to the first power supply line 160, and the second power voltage may be provided to an opposite electrode of each sub-pixel electrically connected to the second power supply line 170.

The data driving circuit 150 may be electrically connected to a data line DL. A data signal of the data driving circuit 150 may be provided to each sub-pixel through a connection line 151 electrically connected to the terminal 140, and the data line DL electrically connected to the connection line 151. Though it is shown in FIG. 3 that the data driving circuit 150 may be arranged on the printed circuit board PCB, the data driving circuit 150 may be arranged on the substrate 100 in another embodiment. For example, the data driving circuit 150 may be arranged between the terminal 140 and the first power supply line 160.

The first power supply line 160 may include a first sub-line 162 and a second sub-line 163 extending in parallel to each other in an x-direction with the display area DA therebetween. The second power supply line 170 may have a loop shape having one open side and partially surround the display area DA.

Figure 4:
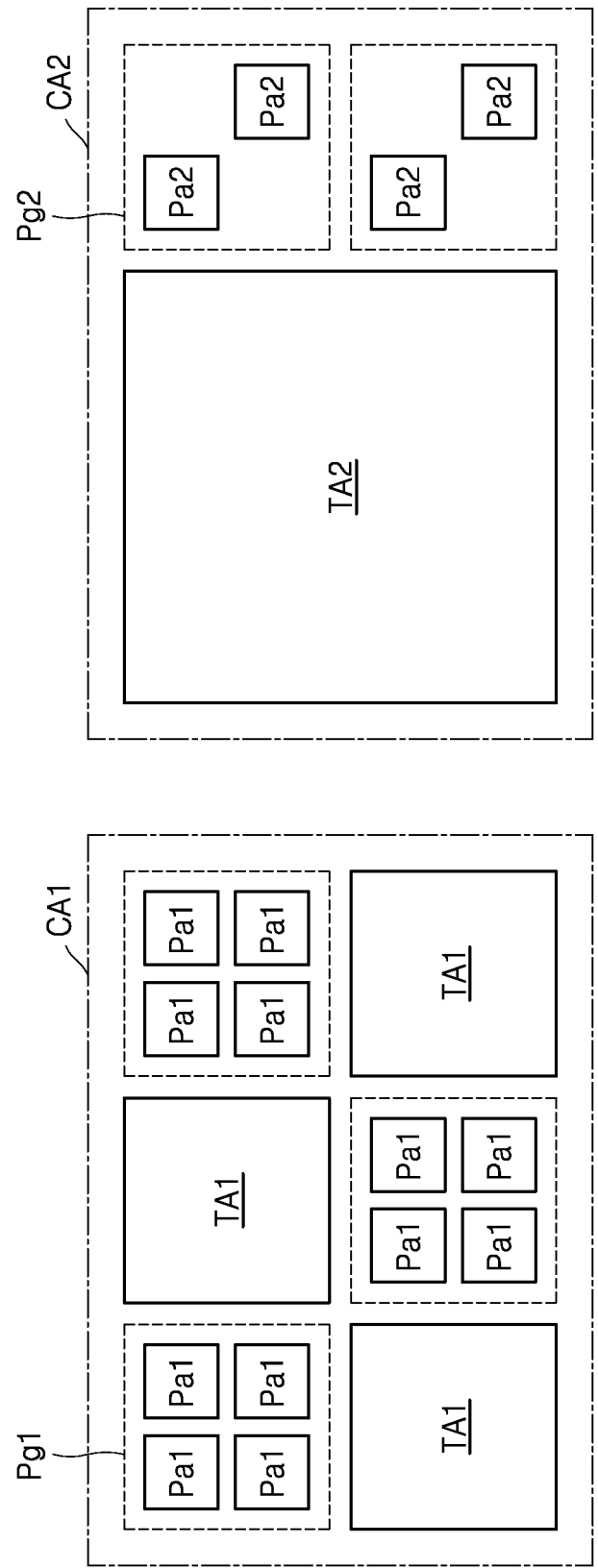
FIG. 4 is a schematic plan view of a portion of a first component area and a second component area of FIG. 1A.

FIG. 4 is a schematic plan view of a portion of the first component area CA1 and the second component area CA2 of FIG. 1A.

Referring to FIG. 4, the first pixel groups Pg1 and the first transmission areas TA1 may be arranged in the first component area CA1 of the display device according to an embodiment. Each of the first pixel groups Pg1 may include a first auxiliary sub-pixel Pa1. The second pixel groups Pg2 and the second transmission areas TA2 may be arranged in the second component area CA2. Each of the second pixel groups Pg2 may include a second auxiliary sub-pixel Pa2. The area of the second transmission area TA2 may be greater than the area of the first transmission area TA1.

In an embodiment, a ratio of the first transmission area TA1 to the first component area CA1 may be less than a ratio of the second transmission area TA2 to the second component area CA2. For example, the area of the first transmission area TA1 per first component area CA1 having the same unit area may be less than the area of the second transmission area TA2 per second component area CA2 having the same unit area.

The first pixel group Pg1 may include at least one first auxiliary sub-pixel Pa1. In an embodiment, as shown in FIG. 4, four first auxiliary sub-pixels Pa1 arranged on two columns may be arranged in one first pixel group Pg1. However, in another embodiment, the number of first auxiliary sub-pixels Pa1 and the arrangement of first auxiliary sub-pixels Pa1 included in the one first pixel group Pg1 may be variously changed.

The second pixel group Pg2 may include at least one second auxiliary sub-pixel Pa2. In an embodiment, as shown in FIG. 4, two second auxiliary sub-pixels Pa2 may be arranged in one second pixel group Pg2. The number of second auxiliary sub-pixels Pa2 arranged in the second pixel group Pg2 may be equal to or less than the number of first auxiliary sub-pixels Pa1 arranged in the first pixel group Pg1. Therefore, the resolution of the second component area CA2 may be less than the resolution of the first component area CA1.

Figure 5A:
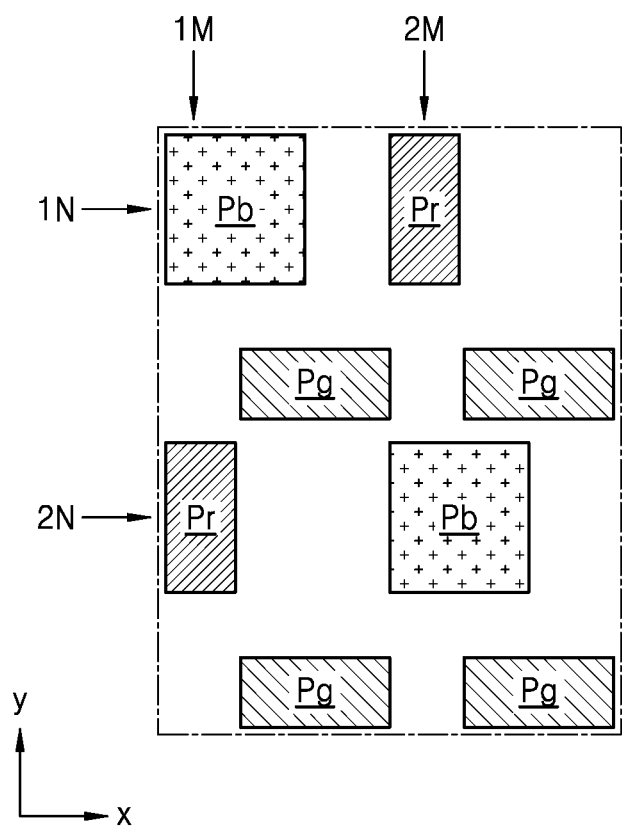
FIG. 5A is a schematic arrangement view of sub-pixels of a display device according to an embodiment.
Figure 5B:
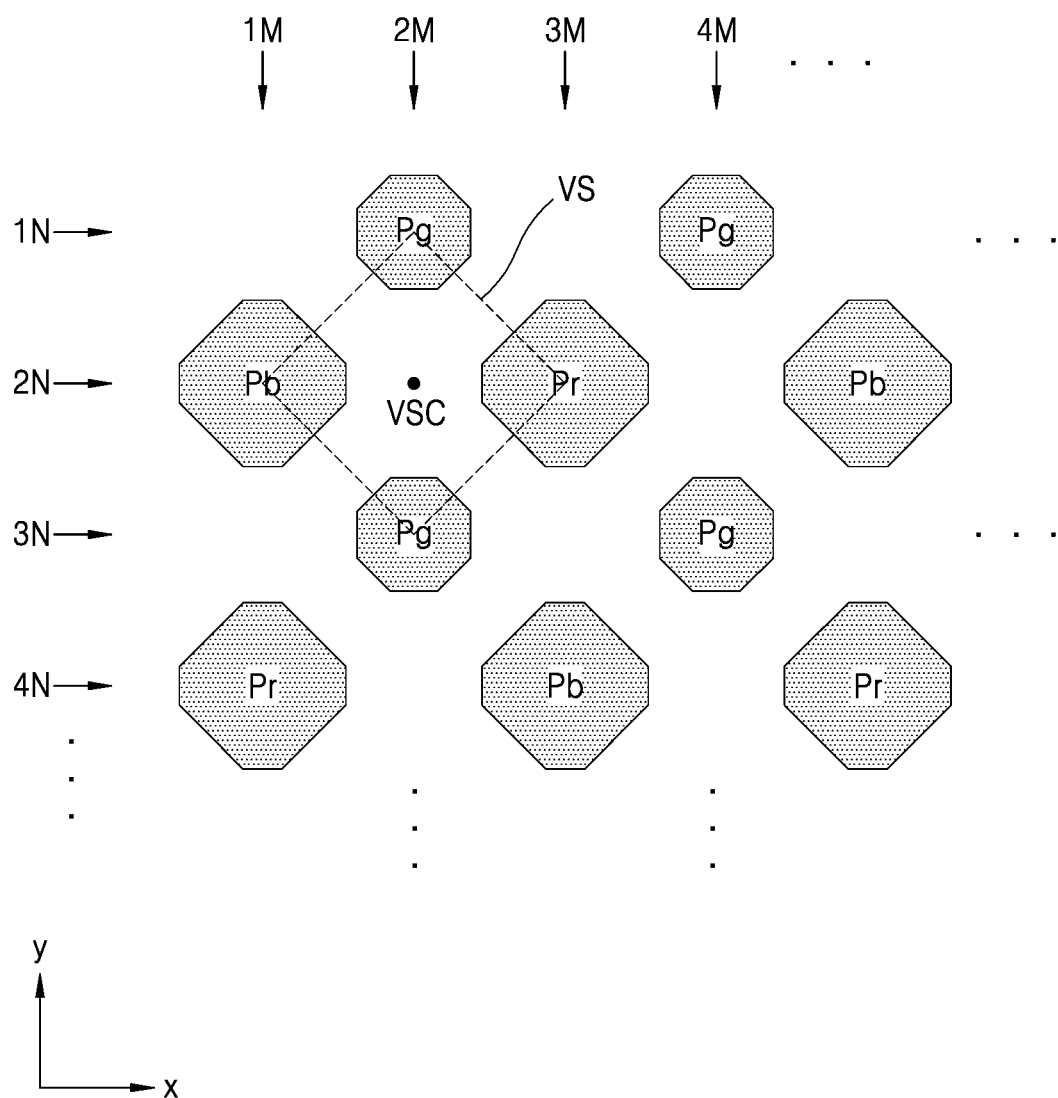
FIG. 5B is a schematic arrangement view of sub-pixels of a display device according to another embodiment.

FIG. 5A is a schematic arrangement view of sub-pixels of the display device according to an embodiment. FIG. 5B is a schematic arrangement view of sub-pixels of the display device according to another embodiment. In an embodiment, a red sub-pixel Pr, a green sub-pixel Pg, and a blue sub-pixel Pb may represent an emission area of an organic light-emitting diode. The emission area may be defined by an opening of a pixel-defining layer described below.

Referring to FIG. 5A, the blue sub-pixel Pb and the red sub-pixel Pr may be alternately arranged on a first row 1N in the x-direction. Likewise, the red sub-pixel Pr and the blue sub-pixel Pb may be alternately arranged on a second row 2N in the x-direction. The green sub-pixels Pg may be apart from each other by an interval between the first row 1N and the second row 2N in the x-direction. Such sub-pixel arrangement may be repeated to a row set in advance.

The green sub-pixels Pg arranged between the first row 1N and the second row 2N may be alternately arranged with the red sub-pixels Pr and the blue sub-pixels Pb arranged in the first row 1N and the second row 2N. Therefore, the blue sub-pixel Pb and the red sub-pixel Pr may be alternately arranged on a first column 1M and a second column 2M in the y-direction, and the green sub-pixels Pg may be apart from each other by an interval between the first column 1M and the second column 2M in the y-direction. Such sub-pixel arrangement may be repeated to a column set in advance.

In an embodiment, the area of the blue sub-pixel Pb may be greater than the area of the red sub-pixel Pr or the area of the green sub-pixel Pg. For example, the red sub-pixel Pr or the green sub-pixel Pg may have a rectangular shape including a long side and a short side, and the blue sub-pixel Pb may have a square shape including the long sides.

Referring to FIG. 5B, the green sub-pixels Pg may be apart from each other by an interval on the first row 1N in the x-direction, and the red sub-pixel Pr and the blue sub-pixel Pb may be alternately arranged in the x-direction on the second row 2N neighboring the first row 1N. Likewise, the green sub-pixels Pg may be apart from each other by an interval on a third row 3N, and the red sub-pixel Pr and the blue sub-pixel Pb may be alternately arranged on a fourth row 4N. Such sub-pixel arrangement may be repeated to a row set in advance.

The green sub-pixels Pg arranged on the first row 1N may be alternately arranged with the red sub-pixels Pr and the blue sub-pixels Pb arranged on the second row 2N. Therefore, the red sub-pixel Pr and the blue sub-pixel Pb may be alternately arranged on the first column 1M in the y-direction, and the green sub-pixels Pg may be apart from each other by an interval on the second column 2M in the y-direction. Such sub-pixel arrangement may be repeated to a column set in advance. The areas of the blue sub-pixel Pb and the red sub-pixel Pr may be greater than the area of the green sub-pixel Pg. As another example, the area of the blue sub-pixel Pb may be greater than the areas of the red sub-pixel Pr and the green sub-pixel Pg.

In other words, the pixel arrangement structure may be expressed as follows, in which the green sub-pixels Pg may be arranged at first and third vertexes facing each other among vertexes of a virtual quadrangle VS, and the blue sub-pixel Pb and the red sub-pixel Pr may be arranged at second and fourth vertexes which may be the rest of the vertexes. For example, the green sub-pixels Pg may be arranged at the vertexes of the virtual quadrangle VS to face each other with respect to a center VSC of the virtual quadrangle VS. The blue sub-pixel Pb and the red sub-pixel Pr may be arranged at vertexes of the virtual quadrangle VS to face each other with respect to the center VSC of the virtual quadrangle VS. The virtual quadrangle VS may be variously modified such as a rectangle, a rhombus, and a square.

Extension lines of edges of the virtual quadrangle VS may be arranged in directions different from the x-direction and the y-direction. Therefore, the virtual quadrangle VS may be tilted with respect to the x-direction and the y-direction.

Sub-pixels emitting light of different colors may be arranged at the vertexes of the virtual quadrangle VS. This sub-pixel arrangement structure may be referred to as a pentile matrix structure. A high resolution may be implemented with a small number of sub-pixels by applying rendering driving that expresses a color by sharing neighboring sub-pixels.

The sub-pixel arrangement structure according to an embodiment may be variously modified. For example, the disclosure may be applicable to a sub-pixel arrangement having a stripe arrangement, a mosaic arrangement, or a delta arrangement. The disclosure may be applicable to a sub-pixel arrangement further including a white sub-pixel emitting white light. Hereinafter, a sub-pixel arrangement of FIG. 5A is described.

Figure 6:
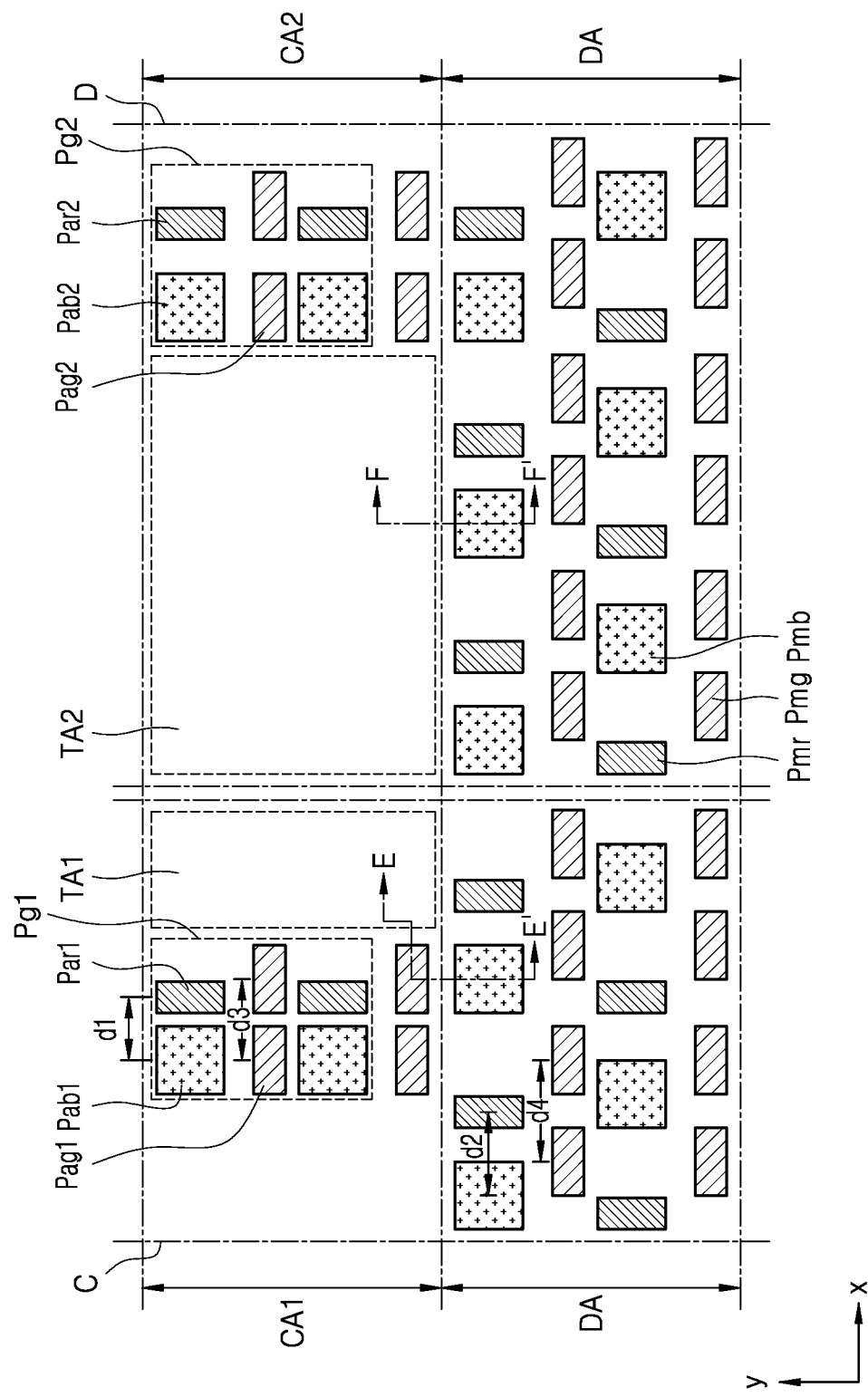
FIG. 6 is an enlarged schematic view of region C and region D of FIG. 1A.

FIG. 6 is an enlarged schematic view of region C and region D of FIG. 1A.

Referring to FIG. 6, the display device 1 may include the display area DA, the first component area CA1, and the second component area CA2, the first pixel group Pg1 and the first transmission area TA1 being arranged in the first component area CA1, and the second pixel group Pg2 and the second transmission area TA2 being arranged in the second component area CA2. Here, the display device 1 may include the substrate, and the substrate may be understood to include the display area DA, the first component area CA1, and the second component area CA2.

The area of the first transmission area TA1 may be less than the area of the second transmission area TA2. For example, the width of the first transmission area TA1 in the x-direction may be less than the width of the second transmission area TA2 in the x-direction.

Main sub-pixels Pmr, Pmg, and Pmb may be arranged in the display area DA. In an embodiment, the main sub-pixels Pmr, Pmg, and Pmb may be arranged in the pentile matrix structure.

First auxiliary sub-pixels Par1, Pag1, Pab1 may be arranged in the first pixel group Pg1. In an embodiment, the green sub-pixel Pag1 of the first auxiliary sub-pixel may be arranged between red sub-pixels Par1 of a neighboring first auxiliary sub-pixel, or between blue sub-pixels Pab1 of a neighboring first auxiliary sub-pixel. In another embodiment, the first auxiliary sub-pixels Par1, Pag1, Pab1 may be arranged in the pentile matrix structure.

Second auxiliary sub-pixels Par2, Pag2, Pab2 may be arranged in the second pixel group Pg2. The green sub-pixel Pag2 of the second auxiliary sub-pixel may be arranged between red sub-pixels Par2 of a neighboring second auxiliary sub-pixel, or between blue sub-pixels Pab2 of a neighboring second auxiliary sub-pixel. In another embodiment, the second auxiliary sub-pixels Par2, Pag2, Pab2 may be arranged in the pentile matrix structure.

In an embodiment, a first distance between centers of the first auxiliary sub-pixels Par1, Pag1, and Pab1 that neighbor each other may be different from a second distance between centers of the main sub-pixels Pmr, Pmg, and Pmb that neighbor each other. For example, a first distance d1 between centers of the red sub-pixel Par1 of a neighboring first auxiliary sub-pixel and the blue sub-pixel Pab1 of a neighboring first auxiliary sub-pixel may be different from a second distance d2 between centers of the red sub-pixel Pmr of a neighboring main sub-pixel and the blue sub-pixel Pmb of a neighboring main sub-pixel. For another example, a first distance d3 of the green sub-pixels Pag1 of a neighboring first auxiliary sub-pixel may be different from a second distance d4 of the green sub-pixels Pmg of a neighboring main sub-pixel. Particularly, the first distances d1 and d3 may be less than the second distances d2 and d4. Therefore, the first auxiliary sub-pixels Par1, Pag1, and Pab1 in the first component area CA1 may be more densely arranged than the main sub-pixels Pmr, Pmg, and Pmb in the display area DA. This may be because the first component area CA1 has a proper resolution while including the first transmission area TA1.

In an embodiment, a distance between centers of neighboring second auxiliary sub-pixels Par2, Pag2, and Pab2 may be different from a distance between centers of neighboring main sub-pixels Pmr, Pmg, and Pmb. In another embodiment, a distance between the centers of the neighboring second auxiliary sub-pixels Par2, Pag2, and Pab2 and a distance between the centers of the neighboring main sub-pixels Pmr, Pmg, and Pmb may be a same distance.

Figure 7:
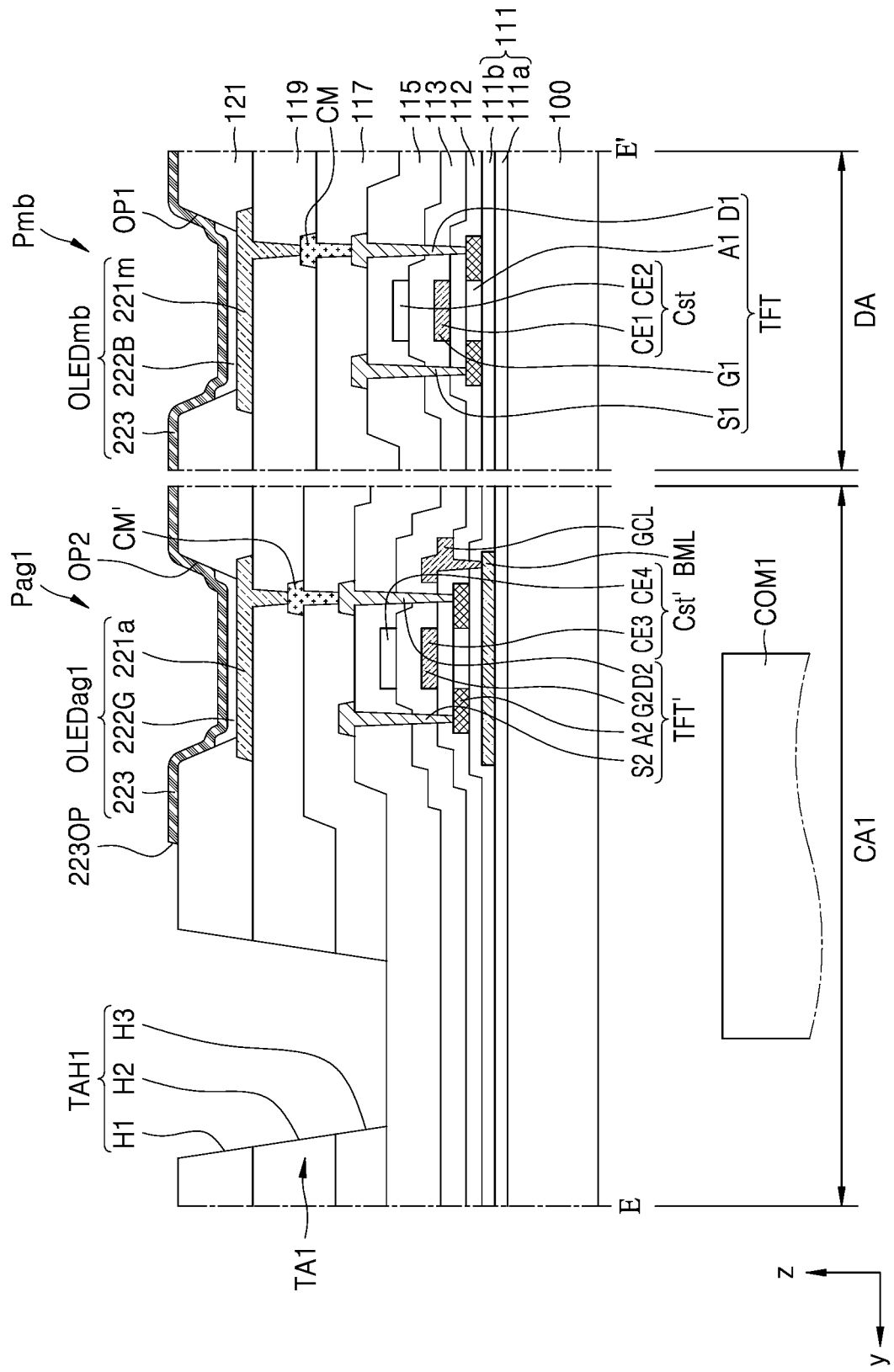
FIG. 7 is a schematic cross-sectional view of the display device taken along line E-E' of FIG. 6.
Figure 8:
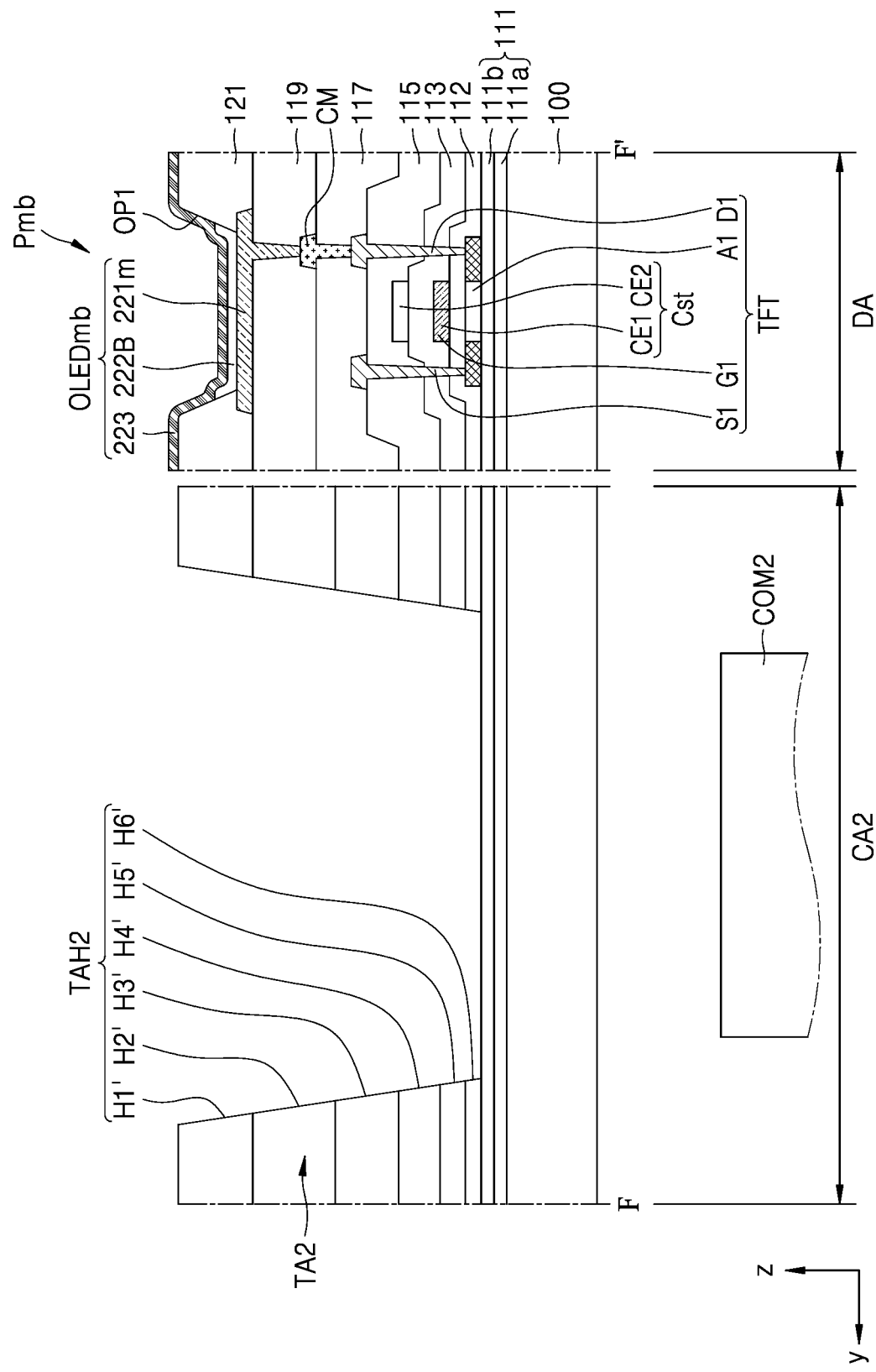
FIG. 8 is a schematic cross-sectional view of the display device taken along line F-F' of FIG. 6.

FIG. 7 is a schematic cross-sectional view of the display device taken along line E-E' of FIG. 6. FIG. 8 is a schematic cross-sectional view of the display device taken along line F-F' of FIG. 6. It is shown in FIG. 7 that the blue sub-pixel Pmb of the main sub-pixel, the green sub-pixel Pag1 of the first auxiliary sub-pixel, and the first transmission area TA1 may be arranged. It is shown in FIG. 8 that the blue sub-pixel Pmb of the main sub-pixel and the second transmission area TA2 may be arranged.

Referring to FIG. 7, a main thin film transistor TFT, a main storage capacitor Cst, and a main blue organic light-emitting diode OLEDmb may be arranged in the display area DA. A first thin film transistor TFT', a first storage capacitor Cst', and a first auxiliary green organic light-emitting diode OLEDag1 may be arranged in the first component area CA1.

The first component COM1 may be arranged below the first component area CA1. The first component COM1 may include an infrared (IR) sensor that transmits/receives infrared light. Particularly, the first component COM1 may include a proximity sensor or an ambient light sensor. Since the first transmission area TA1 may be arranged in the first component area CA1, an infrared signal transmitted/received from/to the first component COM1 may pass through the first transmission area TA1. For example, light emitted from the first component COM1 may progress in a z-direction through the first transmission area TA1, and light that may be generated outside the display device and that may be incident to the first component COM1 may progress in a (−) z-direction through the first transmission area TA1.

Hereinafter, a structure in which elements may be stacked on each other is described according to an embodiment.

A buffer layer 111 may be located on the substrate 100, may reduce or block the penetration of foreign substances, moisture or external air from below the substrate 100, and provide a flat surface on the substrate 100. The buffer layer 111 may include an inorganic material such as an oxide, a nitride, or a combination thereof, or an organic material, or an organic/inorganic composite material and include a single layer or a multi-layer including the inorganic material and the organic material. A barrier layer (not shown) may be further included between the substrate 100 and the buffer layer 111, the barrier layer blocking the penetration of external air. In an embodiment, the buffer layer 111 may include silicon oxide ($SiO_2$), silicon nitride ($SiN_x$), or a combination thereof. The buffer layer 111 may include a first buffer layer 111a and a second buffer layer 111b that may be stacked on each other.

The bottom metal layer BML may be arranged between the first buffer layer 111a and the second buffer layer 111b in the first component area CA1. In another embodiment, the bottom metal layer BML may be arranged between the substrate 100 and the first buffer layer 111a. The bottom metal layer BML may be arranged below the first thin film transistor TFT' to prevent a characteristic of the first thin film transistor TFT' from being deteriorated by light emitted from the first component COM1.

The bottom metal layer BML may be electrically connected to a wiring GCL arranged on a different layer through a contact hole. The bottom metal layer BML may receive a constant voltage or a signal from the wiring GCL. For example, the bottom metal layer BML may receive a driving voltage or a scan signal. Since the bottom metal layer BML receives a constant voltage or a signal, a probability that electrostatic discharge occurs may be remarkably reduced. The bottom metal layer BML may include aluminum (Al), platinum (Pt), palladium (Pd), silver (Ag), magnesium (Mg), gold (Au), neodymium (Nd), iridium (Ir), chrome (Cr), nickel (Ni), calcium (Ca), molybdenum (Mo), titanium (Ti), tungsten (W), and/or copper (Cu). The bottom metal layer BML may include a single layer or a multi-layer including the above materials.

The main thin film transistor TFT and the first thin film transistor TFT' may be arranged on the buffer layer 111. The main thin film transistor TFT includes a first semiconductor layer A1, a first gate electrode G1, a first source electrode S1, and a first drain electrode D1. The first thin film transistor TFT' includes a second semiconductor layer A2, a second gate electrode G2, a second source electrode S2, and a second drain electrode D2. The main thin film transistor TFT may be electrically connected to the main blue organic light-emitting diode OLEDmb of the display area DA to drive the main blue organic light-emitting diode OLEDmb. The first thin film transistor TFT' may be electrically connected to the first auxiliary green organic light-emitting diode OLEDag1 to drive the first auxiliary green organic light-emitting diode OLEDag1.

The first semiconductor layer A1 and the second semiconductor layer A2 may be arranged on the buffer layer 111 and may include polycrystalline silicon. In another embodiment, the first semiconductor layer A1 and the second semiconductor layer A2 may include amorphous silicon. In another embodiment, the first semiconductor layer A1 and the second semiconductor layer A2 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The first semiconductor layer A1 and the second semiconductor layer A2 may include a channel region, a source region, and a drain region, the source region and the drain region being doped with impurities.

The second semiconductor layer A2 may overlap the bottom metal layer BML with the second buffer layer 111b therebetween. In an embodiment, the width of the second semiconductor layer A2 may be less than the width of the bottom metal layer BML. Therefore, in case projected from a direction perpendicular to the substrate 100, the first semiconductor layer A1 may entirely overlap the bottom metal layer BML.

A first gate insulating layer 112 may cover the first semiconductor layer A1 and the second semiconductor layer A2. The first gate insulating layer 112 may include inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide (Ta2O5), hafnium oxide ($HfO_2$), zinc oxide ($ZnO_2$), or a combination thereof. The first gate insulating layer 112 may include a single layer or a multi-layer including the inorganic insulating materials.

The first gate electrode G1 and the second gate electrode G2 may be arranged on the first gate insulating layer 112 to respectively overlap the first semiconductor layer A1 and the second semiconductor layer A2. The first gate electrode G1 and the second gate electrode G2 may include a single layer or a multi-layer including at least one of molybdenum (Mo), aluminum (Al), copper (Cu), and titanium (Ti). In an embodiment, the first gate electrode G1 and the second gate electrode G2 may include a single Mo layer.

A second gate insulating layer 113 may cover the first gate electrode G1 and the second gate electrode G2. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or a combination thereof. The second gate insulating layer 113 may include a single layer or a multi-layer including the above inorganic insulating materials.

A first top electrode CE2 of the main storage capacitor Cst and a second top electrode CE4 of the first storage capacitor Cst' may be arranged on the second gate insulating layer 113.

The first top electrode CE2 may overlap the first gate electrode G1 therebelow in the display area DA. The first gate electrode G1 and the first top electrode CE2 overlapping each other with the second gate insulating layer 113 therebetween may constitute the main storage capacitor Cst. The first gate electrode G1 may serve as a first bottom electrode CE1 of the main storage capacitor Cst.

The second top electrode CE4 may overlap the second gate electrode G2 therebelow in the first component area CA1. The second gate electrode G2 and the second top electrode CE4 overlapping each other with the second gate insulating layer 113 therebetween may constitute the first storage capacitor Cst'. The first gate electrode G1 may serve as a second bottom electrode CE3 of the first storage capacitor Cst'.

The first top electrode CE2 and the second top electrode CE4 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and include a single layer or a multi-layer including the above materials.

A first interlayer insulating layer 115 may cover the first top electrode CE2 and the second top electrode CE4. The first interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or a combination thereof.

The source electrodes (e.g., the first and second source electrodes S1 and S2) and the drain electrodes (e.g., the first and second drain electrodes D1 and D2) may be arranged on the first interlayer insulating layer 115. The source electrodes (e.g., the first and second source electrodes S1 and S2) and the drain electrodes (e.g., the first and second drain electrodes D1 and D2) may include a conductive material including molybdenum (Mo), aluminum (Al), copper (Cu), titanium (Ti), or a combination thereof, and include a single layer or a multi-layer including the above materials. For example, the first and second source electrodes S1 and S2 and the first and second drain electrodes D1 and D2 may have a multi-layered structure of Ti/Al/Ti.

A second interlayer insulating layer 117 may cover the first and second source electrodes S1 and S2 and the first and second drain electrodes D1 and D2. The second interlayer insulating layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or a combination thereof.

A main connection metal CM and a first auxiliary connection metal CM' may be arranged on the second interlayer insulating layer 117. The main connection metal CM and the first auxiliary connection metal CM' may be respectively and electrically connected to the main thin film transistor TFT and the first thin film transistor TFT' by respectively contacting the first drain electrode D1 of the main thin film transistor TFT and the second drain electrode D2 of the first thin film transistor TFT' through openings formed in the second interlayer insulating layer 117.

A wiring (not shown) may be further arranged on the second interlayer insulating layer 117, the wiring being apart from the main connection metal CM and the first auxiliary connection metal CM'. The wiring and the main connection metal CM and the first auxiliary connection metal CM' may include a same material.

A planarization layer 119 may be arranged on the main connection metal CM and the first auxiliary connection metal CM'. The planarization layer 119 may have a flat top surface such that a main pixel electrode 221m and a first auxiliary pixel electrode 221a may be formed flat.

The planarization layer 119 may include a single layer or a multi-layer including an organic material or an inorganic material. The planarization layer 119 may include a general-purpose polymer such as benzocyclobutene (BCB), polyimide, hexamethyldisiloxane (HMDSO), polymethylmethacrylate (PMMA), polystyrene (PS), or a combination thereof, polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The planarization layer 119 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or a combination thereof. After the planarization layer 119 may be formed, chemical mechanical polishing may be performed to provide a flat top surface.

There may be openings in the planarization layer 119, the openings exposing the main connection metal CM and the first auxiliary connection metal CM'. The main pixel electrode 221m may be electrically connected to the main thin film transistor TFT by contacting the main connection metal CM through the opening. The planarization layer 119 may include an opening that exposes the first auxiliary connection metal CM'. The first auxiliary pixel electrode 221a may be electrically connected to the first thin film transistor TFT' by contacting the auxiliary connection metal CM' through the opening.

The main pixel electrode 221m and the first auxiliary pixel electrode 221a may include a conductive oxide such as indium tin oxide (ITO), indium zinc oxide (IZO), zinc oxide (ZnO), indium oxide ($In_2O_3$), indium gallium oxide (IGO), aluminum zinc oxide (AZO), or a combination thereof. In another embodiment, the main pixel electrode 221m and the first auxiliary pixel electrode 221a may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the main pixel electrode 221m and the first auxiliary pixel electrode 221a may further include a layer including ITO, IZO, ZnO, $In_2O_3$, or a combination thereof, on/under the reflective layer. In an embodiment, the main pixel electrode 221m and the first auxiliary pixel electrode 221a may have a stacked structure of ITO/Ag/ITO.

A pixel-defining layer 121 may cover the edges of the main pixel electrode 221m and the first auxiliary pixel electrode 221a. The pixel-defining layer 121 may include a first opening OP1 and a second opening OP2 respectively overlapping the main pixel electrode 221m and the first auxiliary pixel electrode 221a and respectively defining the blue sub-pixel Pmb of the main sub-pixel and the green sub-pixel Pag1 of the first auxiliary sub-pixel. The pixel-defining layer 121 may prevent an arc, etc. from occurring at the edges of the pixel electrodes (e.g., the main pixel electrode 221m and the first auxiliary pixel electrode 221a) by increasing a distance between the edges of the pixel electrodes (e.g., the main pixel electrode 221m and the first auxiliary pixel electrode 221a) and an opposite electrode 223 over the pixel electrodes (e.g., the main pixel electrode 221m and the first auxiliary pixel electrode 221a). The pixel-defining layer 121 may include an organic insulating material including polyimide, polyamide, an acrylic resin, benzocyclobutene, HMDSO, a phenolic resin, or a combination thereof, and be formed by spin coating.

A blue emission layer 222B and a green emission layer 222G may be arranged to respectively correspond to the main pixel electrode 221m and the first auxiliary pixel electrode 221a. The blue emission layer 222B and the green emission layer 222G may include a polymer material or a low molecular weight material and emit red, green, blue, or white light.

The opposite electrode 223 may be arranged on the blue emission layer 222B and the green emission layer 222G. The opposite electrode 223 may include a conductive material having a small work function. For example, the opposite electrode 223 may include a (semi-)transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. As another example, the opposite electrode 223 may further include a layer including ITO, IZO, ZnO, or $In_2O_3$, or a combination thereof, on the (semi)-transparent layer including the above materials. The opposite electrode 223 may be formed as one body over the display area DA and the first component area CA1. A functional layer may be further arranged between the pixel electrodes (e.g., the main pixel electrode 221m and the first auxiliary pixel electrode 221a) and the emission layers (e.g., the blue emission layer 222B and the green emission layer 222G) and/or between the emission layers (e.g., the blue emission layer 222B and the green emission layer 222G) and the opposite electrode 223. In an embodiment, the opposite electrode 223 may not be arranged in the first transmission area TA1. The opposite electrode 223 may include an opposite electrode opening 2230P corresponding to the first transmission area TA1.

Layers ranging from the main pixel electrode 221m to the opposite electrode 223 formed in the display area DA may constitute a main blue organic light-emitting diode OLEDmb. Layers ranging from the first auxiliary pixel electrode 221a to the opposite electrode 223 formed in the first component area CA1 may constitute a first auxiliary green organic light-emitting diode OLEDag1.

The thin-film encapsulation layer, the optical functional layer, etc. may be arranged on the opposite electrode 223 as described above.

In an embodiment, at least one of the second interlayer insulating layer 117, the planarization layer 119, and the pixel-defining layer 121 may include a first transmission hole TAH1 corresponding to the first transmission area TA1. In an embodiment, the first transmission hole TAH1 may expose a top surface of the first interlayer insulating layer 115. The first transmission hole TAH1 may include a first hole H1 of the pixel-defining layer 121, a second hole H2 of the planarization layer 119, and a third hole H3 of the second interlayer insulating layer 117. The first, second, and third holes H1, H2, H3 may overlap each other. The first hole H1 to the third hole H3 may be individually formed by a separate process or simultaneously formed by a same process. As another example, the second hole H2 and the third hole H3 may be simultaneously formed and the first hole H1 may be separately formed. In the case where the first hole H1 to the third hole H3 may be formed by a separate process, a step difference may be formed on a lateral surface of the first transmission hole TAH1. In an embodiment, the first transmission hole TAH1 may include only the first hole H1 to expose a top surface of the planarization layer 119. In another embodiment, the first transmission hole TAH1 may not correspond to the first transmission area TA1.

Since the organic and inorganic stacked structure may be omitted on the substrate 100, a signal processing of the first component COM1 may be performed more swiftly and precisely.

Referring to FIG. 8, the second component COM2 may be arranged in the second component area CA2. The second component COM2 may include an infrared sensor that transmits/receives infrared light. Particularly, the second component COM2 may include a camera, an infrared (IR) camera, a dot projector, an infrared (IR) illuminator, or a time-of-flight (ToF) sensor. Since the second transmission area TA2 may be arranged in the second component area CA2, an infrared signal transmitted/received from/to the second component COM2 may pass through the second transmission area TA2. For example, light emitted from the second component COM2 may progress in a z-direction through the second transmission area TA2, and light that may be generated outside the display device and that may be incident to the second component COM2 may progress in a (−) z-direction through the second transmission area TA2.

In an embodiment, at least one of the first gate insulating layer 112, the second gate insulating layer 113, the first interlayer insulating layer 115, the second interlayer insulating layer 117, the planarization layer 119, and the pixel-defining layer 121 may include a second transmission hole TAH2 corresponding to the second transmission area TA2. The second transmission hole TAH2 may expose a top surface of the buffer layer 111. The second transmission hole TAH2 may include a first hole H1' of the pixel-defining layer 121, a second hole H2' of the planarization layer 119, a third hole H3' of the second interlayer insulating layer 117, a fourth hole H4' of the first interlayer insulating layer 115, a fifth hole H5' of the second gate insulating layer 113, and a sixth hole H6' of the first gate insulating layer 112 that overlap each other. The first hole H1' to the sixth hole H6' may be individually formed by a separate process or simultaneously formed by a same process. As another example, the second hole H2' to the sixth hole H6' may be simultaneously formed and the first hole H1' may be separately formed. In the case where the first hole H1' to the sixth hole H6' may be formed by a separate process, a step difference may be formed on a lateral surface of the second transmission hole TAH2. In an embodiment, the second transmission hole TAH2 may include only the first hole H1' to expose a top surface of the planarization layer 119. In another embodiment, the second transmission hole TAH2 may include the first hole H1' and the second hole H2' to expose a top surface of the second interlayer insulating layer 117. In another embodiment, the second transmission hole TAH2 may not correspond to the second transmission area TA2.

Since the organic and inorganic stacked structure may be omitted on the substrate 100, a signal processing of the second component COM2 may be performed more swiftly and precisely.

In an embodiment, the components (e.g., the first component COM1 and the second component COM2) may respectively have different transmittances. For example, a transmittance required for a proximity sensor may be different from a transmittance required for an infrared camera. Specifically, a light transmittance required for an infrared camera, a dot projector, or a ToF sensor, etc. to perform a proper function may be greater than a light transmittance required for a proximity sensor or an ambient light sensor to perform a proper function. In case that sub-pixels may be arranged in a region in which a component is arranged while meeting a light transmittance required for each component, an image may be displayed and simultaneously a function of the component may be performed.

An embodiment may include the first component area CA1 and the second component area CA2, the first transmission area TA1 being arranged in the first component area CA1, and the second transmission area TA2 having an area different from the area of the first transmission area TA2 and being arranged in the second component area CA2. A transmittance of the first component area CA1 may be different from a transmittance of the second component area CA2. The first component COM1 may be arranged to correspond to the first component area CA1 to meet a transmittance required for the first component COM1, and the second component COM2 may be arranged to correspond to the second component CA2 to meet a transmittance required for the second component COM2, the second component COM2 being different from the first component COM1. Therefore, since the first component COM1 and the second component COM2 may be respectively arranged in the first component area CA1 and the second component area CA2 according to required transmittances, a display device in which an image may be displayed in the component areas (e.g., the first component area CA1 and the second component area CA2) without deteriorating the functions of the components (e.g., the first component COM1 and the second component COM2) may be implemented.

Figure 9A:
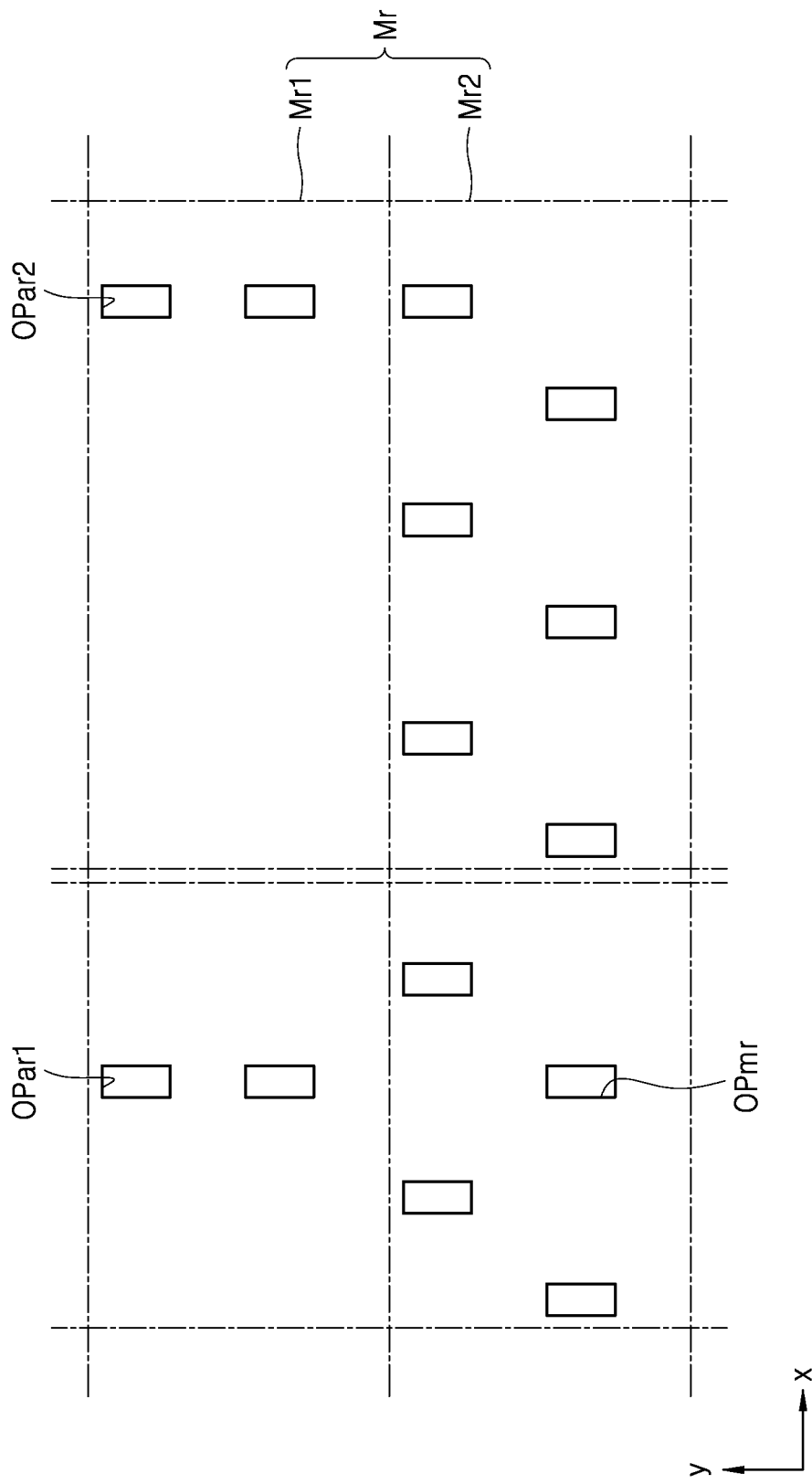
Figure 9C:
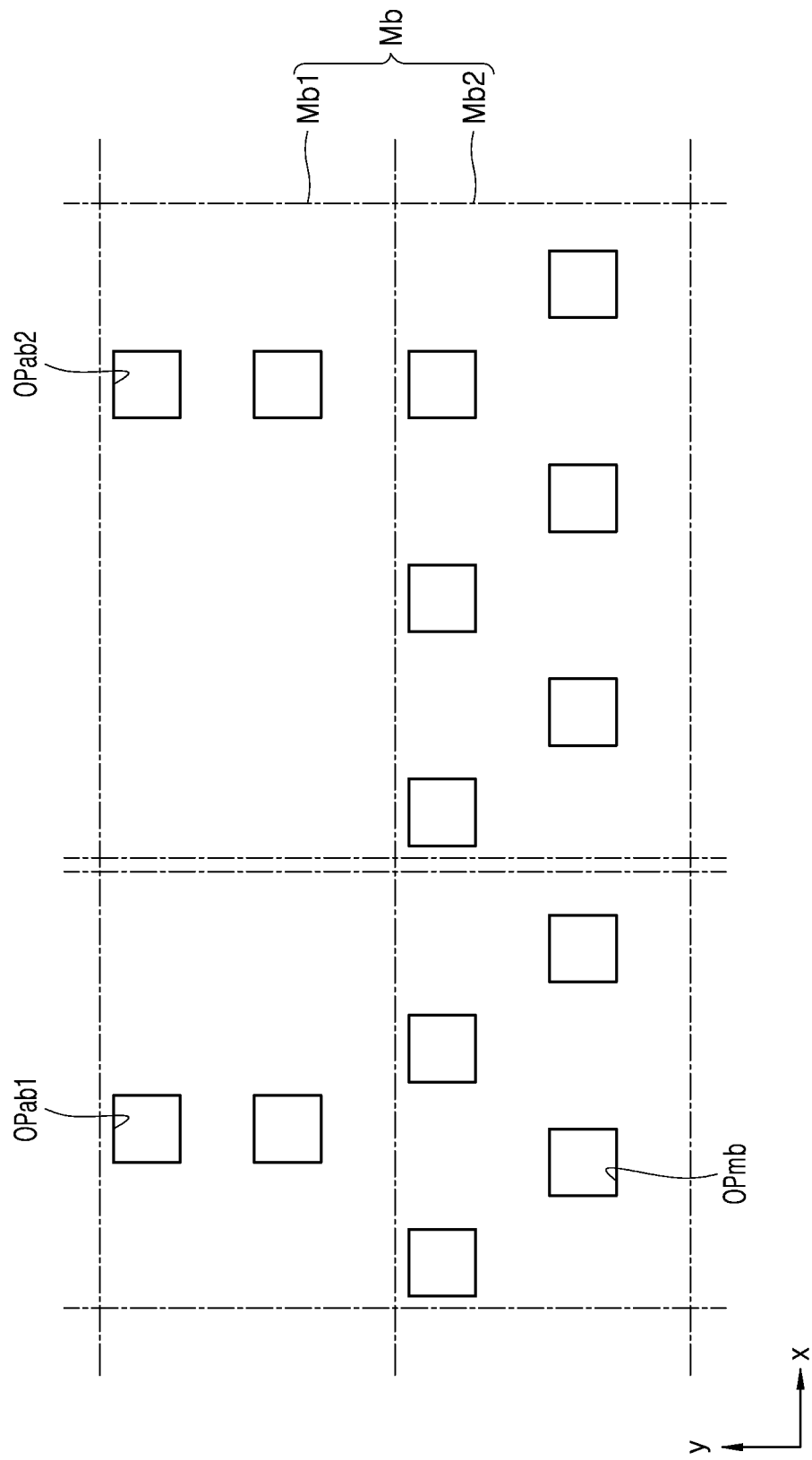
Figure 10A:
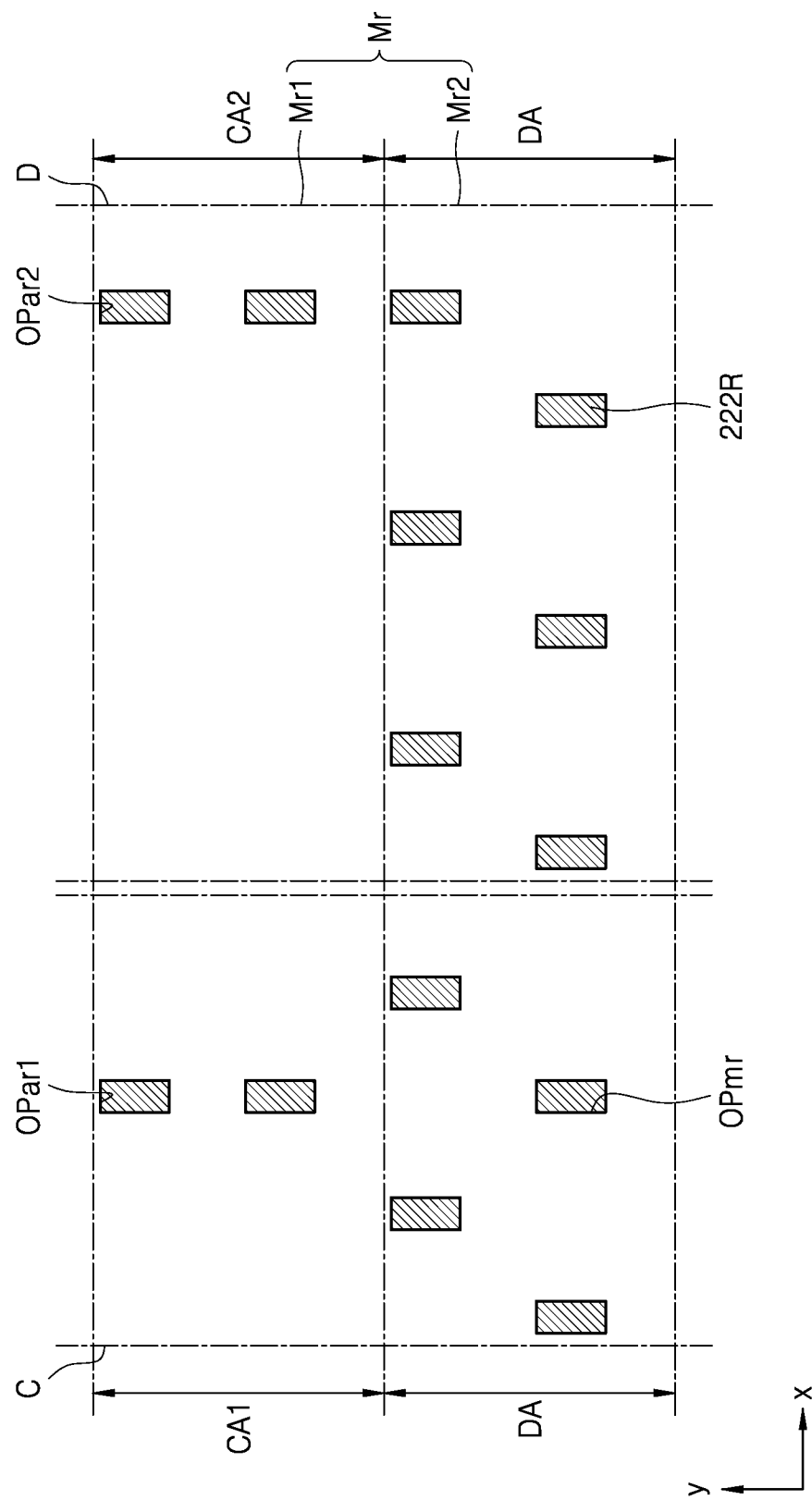
FIGS. 10A to 10C are schematic plan views showing a method of manufacturing a display device by using a first mask to a third mask.
Figure 10B:
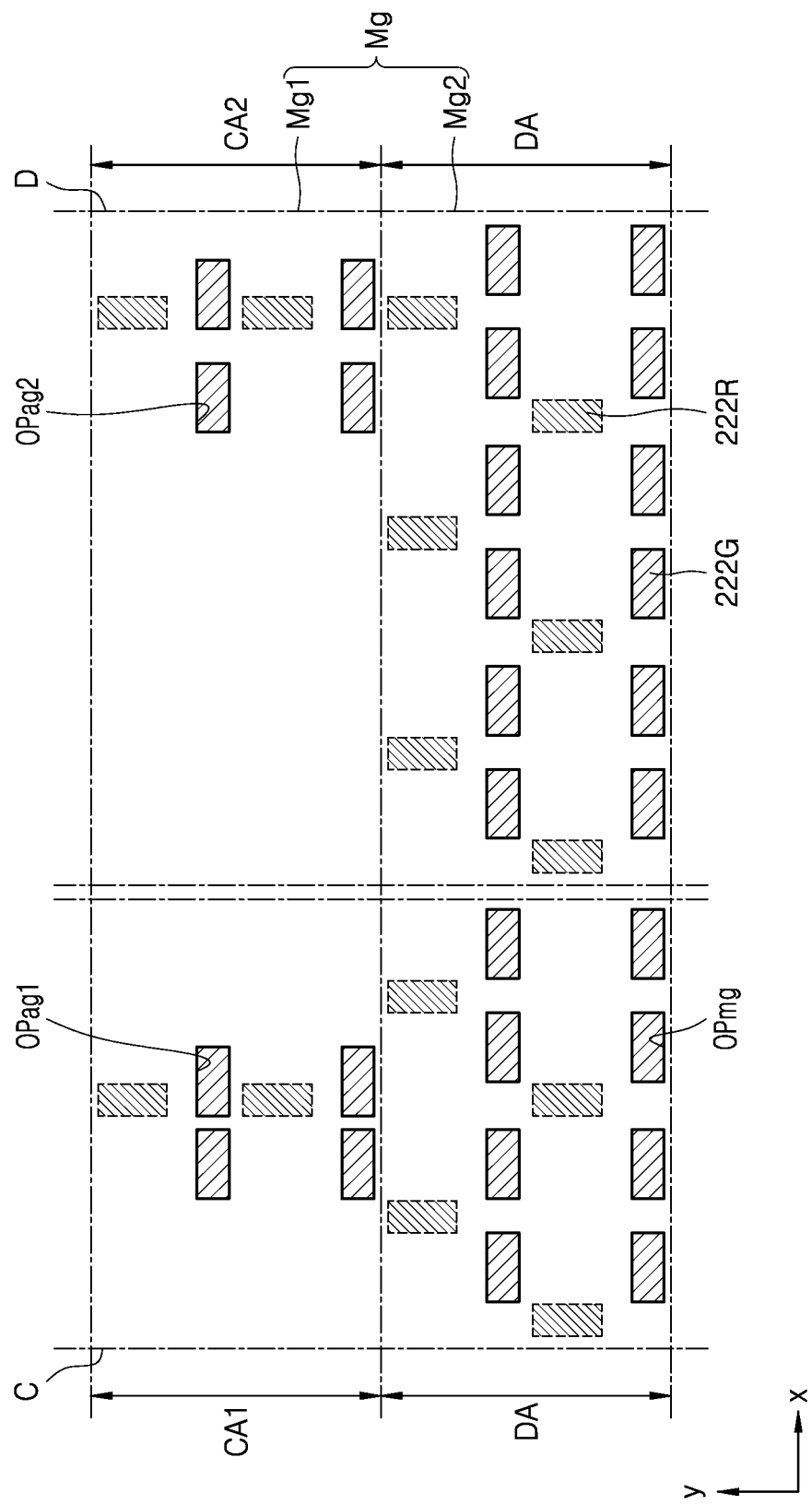
Figure 10C:
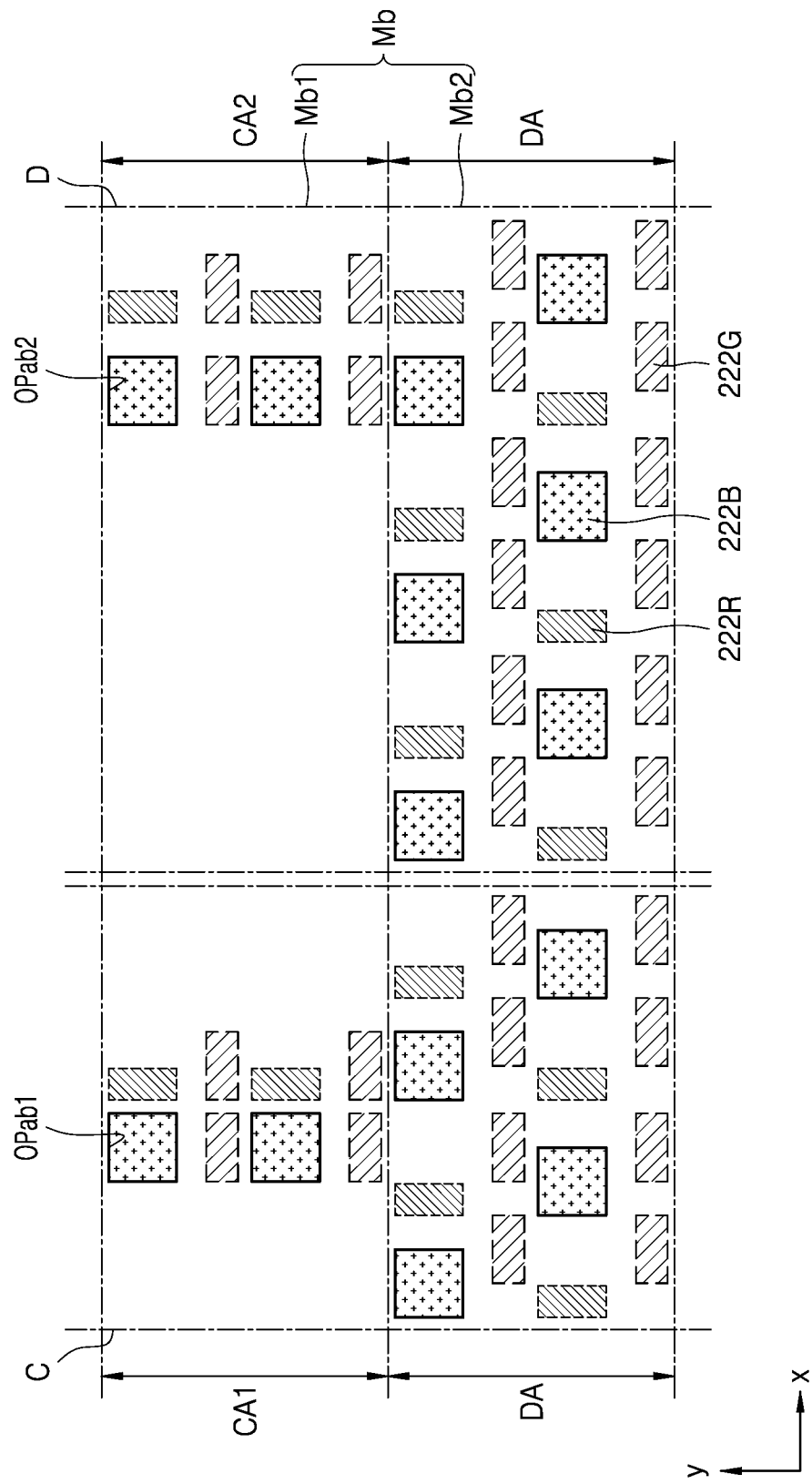

FIGS. 9A to 9C are schematic plan views of examples of a first mask Mr to a third mask Mb used for manufacturing a display device according to an embodiment. FIGS. 10A to 10C are plan views showing a method of manufacturing a display device by using the first mask Mr to the third mask Mb.

Referring to FIG. 9A, the first mask Mr may include a first top mask Mr1 and a first bottom mask Mr2. In an embodiment, the first top mask Mr1 and the first bottom mask Mr2 may include mask sticks that may be apart from each other and fixed to a mask frame. In another embodiment, the first top mask Mr1 and the first bottom mask Mr2 may be provided as one body.

The first top mask Mr1 may include a first auxiliary opening OPar1 of the first top mask Mr1 and a second auxiliary opening OPar2 of the first top mask Mr1. The first auxiliary openings OPar1 of the first top mask Mr1 and the second auxiliary openings OPar2 of the first top mask Mr1 may be apart from each other.

The first bottom mask Mr2 may include a main opening OPmr of the first bottom mask Mr2. The main openings OPmr of the first bottom mask Mr2 may be arranged with an interval.

Referring to FIG. 9B, a second mask Mg may include a second top mask Mg1 and a second bottom mask Mg2. In an embodiment, the second top mask Mg1 and the second bottom mask Mg2 may include mask sticks that may be apart from each other and fixed to the mask frame. In another embodiment, the second top mask Mg1 and the second bottom mask Mg2 may be provided as one body.

The second top mask Mg1 may include first auxiliary openings OPag1 of the second top mask Mg1 and second auxiliary openings OPag2 of the second top mask Mg1. The first auxiliary openings OPag1 of the second top mask Mg1 and second auxiliary openings OPag2 of the second top mask Mg1 may be apart from each other.

The second bottom mask Mg2 may include a main opening OPmg of the second bottom mask Mg2. The main openings OPmg of the second bottom mask Mg2 may be arranged with an interval. An interval OPd1 between neighboring first auxiliary opening OPag1 of the second top mask Mg1 may be less than an interval OPd2 between neighboring main openings OPmg of the second bottom mask Mg2.

Referring to FIG. 9C, the third mask Mb may include a third top mask Mb1 and a third bottom mask Mb2 that may be apart from each other. In an embodiment, the third top mask Mb1 and the third bottom mask Mb2 may include mask sticks that may be apart from each other and fixed to the mask frame. In another embodiment, the third top mask Mb1 and the third bottom mask Mb2 may be provided as one body.

The third top mask Mb1 may include first auxiliary openings OPab1 of the third top mask Mb1 and second auxiliary openings OPab2 of the third top mask Mb1. The first auxiliary openings OPab1 of the third top mask Mb1 and second auxiliary openings OPab2 of the third top mask Mb1 may be apart from each other.

The third bottom mask Mb2 may include a main opening OPmb of the third bottom mask Mb2. The main openings OPmb of the third bottom mask Mb2 may be arranged with an interval.

In an embodiment, the first mask Mr to the third mask Mb may include a fine metal mask (FMM) used for depositing an emission layer. The FMM may be manufactured by forming a hole in a metal plate and applying tensile force thereto.

The openings OPar1, OPar2, and OPmr of the first mask Mr may be for forming a red emission layer and the sizes of the openings OPar1, OPar2, and OPmr may be equal to or less than that of the red emission layer. The openings OPag1, OPag2, and OPmg of the second mask Mg may be for forming a green emission layer and the sizes of the openings OPag1, OPag2, and OPmg may be equal to or less than that of the green emission layer. The openings OPab1, OPab2, and OPmb of the third mask Mb may be for forming a blue emission layer and the sizes of the openings OPab1, OPab2, and OPmb may be equal to or less than that of the blue emission layer.

In an embodiment, the emission layer may be deposited by using the first mask Mr to the third mask Mb. FIG. 10A schematically shows a method of forming a red emission layer 222R by using the first mask Mr. FIG. 10B schematically shows a method of forming a green emission layer 222G by using the second mask Mg. FIG. 10C schematically shows a method of forming a blue emission layer 222B by using the third mask Mb.

Referring to FIG. 10A, after the pixel electrode may be formed on the substrate, the first top mask Mr1 may be arranged to correspond to the first component area CA1 and the second component area CA2. The first bottom mask Mr2 may be arranged to correspond to the display area DA.

The red emission layer 222R may be primarily deposited by emitting a deposition material to be formed as the red emission layer 222R by using a deposition source (not shown). Only a portion of the red emission layer 222R may be formed depending on the arrangement of the openings OPar1, OPar2, and OPmr of the first mask Mr.

As shown in FIG. 10B, after the second top mask Mg1 may be arranged to correspond to the first component area CA1 and the second component area CA2, and the second bottom mask Mg2 may be arranged to correspond to the display area DA, the green emission layer 222G may be secondarily deposited. Only a portion of the green emission layer 222G may be formed depending on the arrangement of the openings OPag1, OPag2, and OPmg of the second mask Mg.

As shown in FIG. 10C, after the third top mask Mb1 may be arranged to correspond to the first component area CA1 and the second component area CA2, and the third bottom mask Mb2 may be arranged to correspond to the display area DA, the blue emission layer 222B may be deposited thirdly. Only a portion of the blue emission layer 222B may be formed depending on the arrangement of the openings OPab1, OPab2, and OPmb of the third mask Mb.

Therefore, a distance between centers of neighboring sub-pixels of the first component area CA1 may be different from a distance between centers of neighboring sub-pixels of the display area DA.

Figure 11:
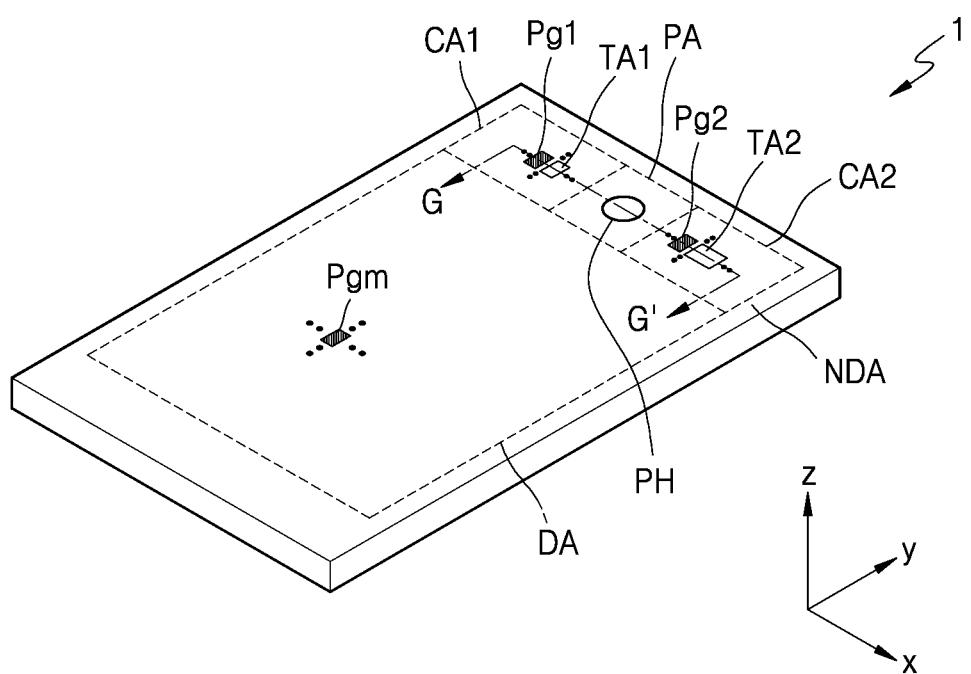
FIG. 11 is a schematic perspective view of a display device according to another embodiment.

FIG. 11 is a schematic perspective view of the display device 1 according to another embodiment. In FIG. 11, since the same reference numerals as those of FIG. 1A denote the same members, repeated descriptions thereof are omitted.

Referring to FIG. 11, the display device 1 may include the display area DA, the first component area CA1, and the second component area CA2, the display area DA including the main pixel group Pgm, the first pixel group Pg1 and the first transmission area TA1 being arranged in the first component area CA1, and the second pixel group Pg2 and the second transmission area TA2 being arranged in the second component area CA2. The area of the first transmission area TA1 may be different from the area of the second transmission area TA2.

The main pixel group Pgm may include main sub-pixels, and the first pixel group Pg1 may include first auxiliary sub-pixels. A first distance between centers of the first auxiliary sub-pixels neighboring each other may be different from a second distance between centers of the main sub-pixels neighboring each other.

In an embodiment, the display device 1 may further include an opening area PA in which a through hole PH may be arranged, the through hole PH passing through the substrate. The opening area PA may be arranged inside the non-display area NDA and may neighbor the first component area CA1 or the second component area CA2. In an embodiment, the opening area PA may be at least partially surrounded by the display area DA.

Though it is shown in FIG. 11 that the opening area PA may be arranged between the first component area CA1 and the second component area CA2, the locations of the opening area PA, the first component area CA1, and the second component area CA2, and the number of opening areas PA, first component areas CA1, and second component areas CA2 may be variously changed.

Figure 12:
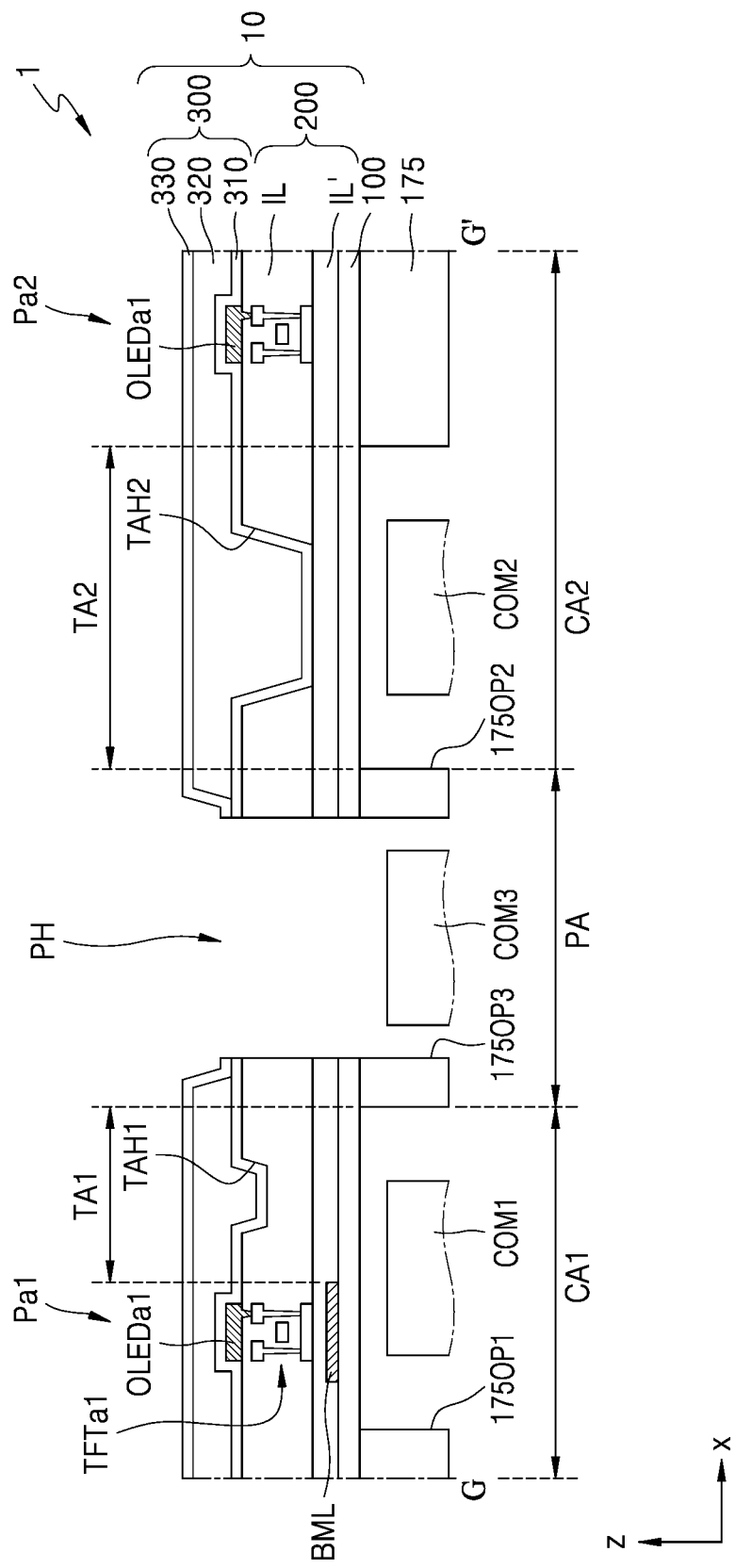
FIG. 12 is a schematic cross-sectional view of the display device taken along line G-G' of FIG. 11.

FIG. 12 is a schematic cross-sectional view of the display device taken along line G-G' of FIG. 11. In FIG. 12, since the same reference numerals as those of FIG. 2 denote the same members, repeated descriptions thereof are omitted.

Referring to FIG. 12, the display device 1 may include the display panel 10, the first component COM1, and the second component COM2, the display panel 10 including a display element, the first component COM1 corresponding to the first component area CA1, and the second component COM2 corresponding to the second component area CA2. The display device 1 may include the first transmission hole TAH1 and the second transmission hole TAH2, the first transmission hole TAH1 corresponding to the first component area CA1, and the second transmission hole TAH2 corresponding to the second component area CA2. The first transmission hole TAH1 may be provided as a groove in an insulating layer IL, the groove corresponding to the first transmission area TA1. Specifically, for example, the first transmission hole TAH1 may be arranged in the pixel-defining layer, the planarization layer, and the second interlayer insulating layer, and may expose a top surface of the first interlayer insulating layer. The second transmission hole TAH2 may be provided in the insulating layer IL, the second transmission hole TAH2 corresponding to the second transmission area TA2. Specifically, for example, the second transmission hole TAH2 may be arranged in the pixel-defining layer, the planarization layer, the second interlayer insulating layer, the first interlayer insulating layer, the second gate insulating layer, and the first gate insulating layer and may expose a top surface of the buffer layer.

In an embodiment, the display device 1 may include the opening area PA in which the through hole PH may be arranged. Here, the substrate 100 may be understood to include opening area PA in which the through hole PH may be disposed. The through hole PH may pass through the substrate 100. The bottom protective film 175, the display element layer 200, and the thin-film encapsulation layer 300 may include openings corresponding to the through hole PH.

In an embodiment, a third component COM3 may be arranged below the substrate 100 to correspond to the through hole PH. The area of the opening area PA may be greater than an area in which the third component COM3 may be arranged.

In an embodiment, the third component COM3 may be different from the first component COM1. Particularly, the third component COM3 may include a camera. However, in an embodiment, the third component COM3 may include at least one of an infrared (IR) camera, a dot projector, an infrared (IR) illuminator, and a time-of-flight (ToF) sensor.

In an embodiment, the bottom protective film 175 may include a third opening 175OP3 corresponding to the opening area PA. Therefore, a light transmittance of the opening area PA may be improved.

An embodiment may include the first component area CA1 and the second component area CA2 having different transmittances and particularly include the opening area PA having a high transmittance. Therefore, for example, a camera requiring a highest light transmittance may be arranged to correspond to the opening area PA, an infrared camera requiring a high light transmittance may be arranged to correspond to the second component area CA2, and a proximity sensor requiring a low light transmittance may be arranged to correspond to the first component area CA1. Therefore, the display device in which functions of the components may not be deteriorated may be implemented.

As described above, according to embodiment, the first component area in which the first transmission area may be arranged, and the second component area in which the second transmission area may be arranged are provided, the area of the first transmission area being different from the area of the second transmission area. Therefore, the transmittance of the first component area may be different from the transmittance of the second component area.

Since the first component may be arranged in the first component area and the second component may be arranged in the second component area depending on required transmittances, an image may be displayed in the first component area and the second component area without deteriorating the function of the components.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, including any equivalents.

What is claimed is:

1. A display device comprising:
   a substrate including:
      a display area;
      a first component area including a first pixel group and a first transmission area; and
      a second component area including a second pixel group and a second transmission area;
   main sub-pixels disposed in the display area; and
   auxiliary sub-pixels disposed in the first pixel group, wherein
   a first distance between adjacent ones of the auxiliary sub-pixels is different from a second distance between adjacent ones of the main sub-pixels.

2. The display device of claim 1, wherein
   the first distance is between centers of the adjacent ones, respectively, of the auxiliary sub-pixels, and
   the second distance is between centers of the adjacent ones, respectively, of the main sub-pixels.

3. The display device of claim 1, wherein an area of the second transmission area is greater than an area of the first transmission area.

4. The display device of claim 1, wherein the first distance is less than the second distance.

5. The display device of claim 1, wherein a ratio of the first transmission area to the first component area is less than a ratio of the second transmission area to the second component area.

6. The display device of claim 1, further comprising:
   a first component disposed in the first component area; and
   a second component disposed in the second component area.

7. The display device of claim 6, wherein the first component and the second component are disposed below the substrate.

8. The display device of claim 6, wherein the first component includes at least one of a proximity sensor and an ambient light sensor.

9. The display device of claim 6, wherein the second component includes at least one of a camera, an infrared (IR) camera, a dot projector, an infrared (IR) illuminator, and a time-of-flight (ToF) sensor.

10. The display device of claim 1, the substrate further including:
    an opening area in which a through hole is disposed, the through hole passing through the substrate; and
    further comprising a third component corresponding to the through hole, the third component being disposed below the substrate.

11. A display device comprising:
    a substrate including:
       a display area;
       a first component area including a first transmission area; and
       a second component area including a second transmission area;
    a first component disposed in the first component area;
    a second component disposed in the second component area; and
    sub-pixels disposed over the substrate, wherein
    an area of the second transmission area is greater than an area of the first transmission area.

12. The display device of claim 11, wherein the first component and the second component are disposed below the substrate.

13. The display device of claim 11, wherein the first component includes at least one of a proximity sensor and an ambient light sensor.

14. The display device of claim 11, wherein the second component includes at least one of a camera, an infrared (IR) camera, a dot projector, an infrared (IR) illuminator, and a time-of-flight (ToF) sensor.

15. The display device of claim 11, wherein
    the sub-pixels include:
       auxiliary sub-pixels disposed in the first component area; and
       main sub-pixels disposed in the display area, and
    a first distance between adjacent ones of the auxiliary sub-pixels is different from a second distance between adjacent ones of the main sub-pixels.

16. The display device of claim 15, wherein
    the first distance is between centers of the adjacent ones, respectively, of the auxiliary sub-pixels, and
    the second distance is between centers of the adjacent ones, respectively, of the main sub-pixels.

17. The display device of claim 15, wherein the first distance is less than the second distance.

18. The display device of claim 11, the substrate further including an opening area in which a through hole is disposed, the through hole passing through the substrate.

19. The display device of claim 18, further comprising a third component corresponding to the through hole, the third component being disposed below the substrate and being different from the first component.

20. The display device of claim 11, further comprising:
    a gate insulating layer and a planarization layer that are disposed between the substrate and the sub-pixels;
    a first transmission hole disposed in the planarization layer, the first transmission hole corresponding to the first transmission area; and
    a second transmission hole disposed in the gate insulating layer and the planarization layer, the second transmission hole corresponding to the second transmission area.

* * * * *